(12) United States Patent
Taima et al.

(10) Patent No.: US 9,541,681 B2
(45) Date of Patent: Jan. 10, 2017

(54) LIGHT EXTRACTION SHEET, ORGANIC ELECTROLUMINESCENCE ELEMENT AND ILLUMINATION DEVICE

(75) Inventors: Yasuo Taima, Tokyo (JP); Kunimasa Hiyama, Tokyo (JP)

(73) Assignee: KONICA MINOLTA HOLDINGS, INC., Tokyo (JP)

( * ) Notice: Subject to any disclaimer, the term of this patent is extended or adjusted under 35 U.S.C. 154(b) by 312 days.

(21) Appl. No.: 13/699,347

(22) PCT Filed: May 17, 2011

(86) PCT No.: PCT/JP2011/061275
§ 371 (c)(1),
(2), (4) Date: Nov. 21, 2012

(87) PCT Pub. No.: WO2011/148823
PCT Pub. Date: Dec. 1, 2011

(65) Prior Publication Data
US 2013/0062654 A1    Mar. 14, 2013

(30) Foreign Application Priority Data
May 26, 2010  (JP) .................................. 2010-120236

(51) Int. Cl.
H01L 51/52    (2006.01)
G02B 5/02     (2006.01)

(52) U.S. Cl.
CPC ........... *G02B 5/0242* (2013.01); *G02B 5/0226* (2013.01); *H01L 51/5268* (2013.01)

(58) Field of Classification Search
CPC . G02B 5/0226; G02B 5/0242; H01L 51/5262; H01L 51/5268
See application file for complete search history.

(56) References Cited

U.S. PATENT DOCUMENTS

2005/0255291 A1* 11/2005 Iwata et al. .................. 428/141
2007/0127127 A1*  6/2007 Hsu et al. .................... 359/599

FOREIGN PATENT DOCUMENTS

| JP | 2002-098809 | 4/2002 |
|----|-------------|--------|
| JP | 2003-107214 | 4/2003 |
| JP | 2004-004777 | 1/2004 |
| JP | 2004-271666 | 9/2004 |

(Continued)

OTHER PUBLICATIONS

Iwata et al., Machine English translation of the description of JP2004004777.*

(Continued)

*Primary Examiner* — Yu Chen
(74) *Attorney, Agent, or Firm* — Lucas & Mercanti, LLP

(57) ABSTRACT

Disclosed is a novel light extraction sheet, which not only improves light extraction efficiency but suppresses color change with the angle of observation, an organic EL element employing this light extraction sheet, and an illumination device employing the element. The light extraction sheet is featured in that it comprises a transparent resin film and provided thereon, a light scatter layer containing a binder resin and light scattering particles with an average particle size of front 0.2 to 1.0 μm dispersed in the binder resin and a concavo-convex layer containing a binder resin and spherical particles with an average particle size of from 3 to 10 μm.

6 Claims, 2 Drawing Sheets

(56) References Cited

FOREIGN PATENT DOCUMENTS

| | | |
|---|---|---|
| JP | 2005-316413 | 11/2005 |
| JP | 2006-023683 | 1/2006 |
| JP | 2008-145499 | 6/2008 |
| JP | 2009-025774 | 2/2009 |
| JP | 2009-187804 | 8/2009 |
| JP | 2009-238694 | 10/2009 |
| WO | 2006/095632 | 9/2006 |
| WO | WO 2010095514 A1 * | 8/2010 |

OTHER PUBLICATIONS

Polybead Polystyrene Micropheres, Technical data sheet 238, Polysciences, Inc., May 16, 2013.*

Pentaerythritol triacrylate specification, Sigma-Aldrich, retrieved Aug. 13, 2015.*

* cited by examiner

LIGHT EXTRACTION SHEET, ORGANIC ELECTROLUMINESCENCE ELEMENT AND ILLUMINATION DEVICE

CROSS REFERENCE TO RELATED APPLICATION

This Application is a 371 of PCT/JP2011/061275 filed on May 17, 2011 which, in turn, claimed the priority of Japanese Patent Application No, 2010-120236 filed on May 26, 2010, both applications are incorporated by reference herein.

FIELD OF THE INVENTION

The present invention relates to a light extraction sheet, an organic electroluminescence element and an illumination device employing the element.

TECHNICAL BACKGROUND

Recently, a surface emitting body has attracted attention which is used as a backlight for various kinds of displays, a display board such as a signboard or an emergency light or a light source for an illuminator or the like, since it has many advantages such as high luminous intensity, high efficiency, small thickness and light weight.

In the surface emitting body, an organic electroluminescence element (hereinafter also referred to as an organic EL element), employing an organic material and emitting light by application of electric energy across the positive and negative poles, can emit light by application of a low voltage of from several volts to several tens of volts. Furthermore, the organic electroluminescence element is particularly noted from the viewpoint that it is a thin and totally solid state element and therefore is advantageous in space saving.

The organic EL element is formed of a transparent substrate and provided thereon, a first electrode, a light emission layer and a second electrode in that order. Voltage being applied across the first electrode and the second electrode, holes injected in the light emission layer from the first electrode, an anode and electrons injected in the light emission layer from the second electrode, a cathode are recombined in the light emission layer, thereby emitting light. This emitted light transmits through the first electrode and the transparent, substrate and is observed by users as light emitted from the organic EL element. It is possible that the wavelength of light emitted from the light emission layer is changed by the kinds of dopants added to the light emission layer.

When a surface emitting body is used as a light source for an illuminator, it is ordinarily required that the light source emit white light. As a method for emitting white light by means of an organic EL element, there is a method which incorporates, in the light emission layer, different emission materials emitting a different light in the form of lamination layers or as a mixture thereof, thereby emitting and mixing lights of various colors to obtain a white colored light.

However, in a thin surface emitting element such as an organic EL element, when the output angle of light, determined by the refractive index of the thin light emission, layer and that of the medium through which the output light passes, is over the critical angle, the emitted light is totally reflected and enclosed within the element, and vanishes as a guided wave. As a result, emitted light except for light output from the front surface of the element vanishes, resulting in lowering of light extraction efficiency (being the ratio of the energy of light emerging outside the element to the energy of light emitted).

The light extraction efficiency (emission efficiency) in the front direction derived from multi-reflection based on classical optics can be approximated to ½ $n^2$ and is almost determined by the refractive index n of the light emission layer. When the refractive index of the light emission layer of an organic EL element is about 1.7, the efficiency of emission from the emission portion of the organic EL element is about 20%. The rest of the emission travels in the direction of the light emission layer plane (dissipates in the transverse direction) or vanishes at the metal electrode on file side of the light emission layer opposite the transparent electrode (is absorbed on the rear side of fire element). That is, the organic EL element emits light at the inner portion of a layer (having a refractive index of 1.7 to about 2.1) with a refractive index higher than that of air, and only extracts 15 to about 20% of light emitted in tire light emission layer.

As a method for improving the light extraction efficiency, disclosed is a method in which a prism sheet or a micro lens array is arranged on the surface of a transparent substrate to form a concave-convex form such as a prism form or a lens form, thereby preventing the total reflection at the interface between the transparent substrate and atmospheric air (refer to for example, Patent Document 1). This method can provide high luminous intensity, but causes chromaticity change or luminous intensity variation with the angle of tire observation. Therefore, there is problem in applying the method to an organic EL element for a white light emission illuminator.

Hitherto, as a backlight of a liquid crystal display, a light diffusion sheer is known which comprises a transparent support and provided thereon, a light diffusion layer with a concavo-convex surface containing a binder resin and resin particles (refer to for example, Patent Documents 2 and 3), In this sheet, the concavo-convex layer containing the resin particles formed on the light output side of the sheet is provided for the purpose of reducing the luminous intensity unevenness due to the light scattering effect. Patent Document 2 discloses a sheet having on the reverse side thereof a concavo-convex layer containing resin particles, but the concavo-convex layer is formed in order to improve the slipping property, but has no influence on the light extraction. Further, a lens sheet is known, which contains fine particles at the lens supporting portion or within the lens (refer to for example, Patent Document 4). This sheet is one forming the lens structure on the light output side by resin molding, and can obtain an extraction effect of light exceeding the critical angle, however, light scatter due particles contained within the sheet is insufficient to suppress chromaticity change with the angle of observation fax the organic EL element. Thus, an attempt to employ a light diffusion sheet for backlight as a light extraction sheet for an organic EL element has been made, however, this light diffusion sheet is employed for the purpose of suppressing luminous intensity unevenness or improving the front luminous intensity in the backlight unit, but is insufficient to improve the performance of for organic EL element. Thus, a novel light extraction sheet for an organic EL element has been sought.

As a light extraction sheet for an organic EL element, disclosed is a film wife a concavo-convex surface which has a haze of not less than 70% and a total optical transmittance of not less than 80% (refer to Patent Document 5). The concavo-convex surface of the film disclosed in this Patent Document utilizes a alight concavo-convex form caused during drying and curing of the resin layer. Therefore, this concavo-convex surface is not sufficient in the light extraction effect, and further has no effect of suppressing color change with the angle of observation.

PRIOR ART

Patent Literatures

Patent Document 1: Japanese Patent O.P.I. Publication No. 2006-23683
Patent Document 2: Japanese Patent O.P.I. Publication No. 2002-98809
Patent Document 3: Japanese Patent O.P.I. Publication No. 2003-107214
Patent Document 4: Japanese Patent O.P.I. Publication No. 2009-25774
Patent Document 5: Japanese Patent O.P.I. Publication No. 2009-238694

DISCLOSURE OF THE INVENTION

Problems to be Solved by the Invention

The present invention has been made in view of the above. An object of the invention is to provide a novel light extraction sheet, which not only improves light extraction efficiency but suppresses color change with the angle of observation, an organic EL element employing this light extraction sheet, and an illumination device employing the element.

Means for Solving the Above Problems

The present inventors have made an extensive study on the above problems, and as a result, they have found that a light extraction sheet comprising a light scatter layer containing a binder resin and specific light scattering particles dispersed in the binder resin and a concavo-convex layer composed of a binder resin and spherical particles, provides an organic EL element having not only improved light extraction efficiency but reduced color change with the angle of observation, which has been difficult to obtain according to conventional techniques.

The above object of the invention is attained by any one of the following constitutions.

(1) A light extraction sheet featured in that it comprises a transparent resin film and provided thereon, a light scatter layer containing a binder resin and light scattering particles with an average particle size of from 0.2 to 1.0 µm dispersed in the binder resin, and a concavo-convex layer containing a binder resin and spherical particles with an average particle size of from 3 to 10 µm.

(2) The light extraction sheet as described in item (1) above, featured in that the concavo-convex layer is a layer formed from a plurality of the spherical particles stacked one on top of another.

(3) The light extraction sheet as described in item (1) or (2) above, featured in that the light scattering particles are inorganic oxide particles with a refractive index of not less than 1.6.

(4) The light extraction sheet as described in any one of items (1) through (3) above, featured in that the light scatter layer is provided on one side of the transparent resin film and the concavo-convex layer on the other side of the transparent resin film.

(5) The light extraction sheet as described in any one of items (1) through (3) above, featured in that the light scatter layer is provided on one side of the transparent resin film and the concavo-convex layer on the light scatter layer.

(6) An organic electroluminescence element comprising a transparent substrate and provided thereon, a transparent conductive layer, an organic electroluminescence layer containing an electron transporting layer, and a counter electrode in that order, featured in that the light extraction sheet as described in item (4) or (5) above is provided on a light output surface of the transparent substrate so that the concavo-convex layer faces the light output surface.

(7) The organic electroluminescence element as described in item (6) above, featured in that the thickness of the electron transporting layer is from 40 to 200 nm.

(8) An illumination device featured in that it employs the organic electroluminescence element as described in item (6) or (7) above.

Effect of the Invention

The present invention can provide a light extraction sheet which not only gives greatly improved light extraction efficiency, but also reduces chromaticity change or luminous intensity variation with the angle of observation, as compared with a conventional one. Further, the present invention can provide an organic electroluminescence element excellent for white light illumination employing the light extraction sheet, and an nomination device employing the element device.

PREFERRED EMBODIMENT FOR CARRYING OUT THE INVENTION

Figure 1:
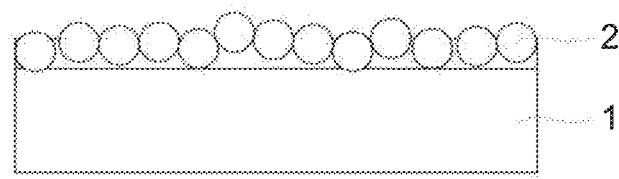
FIG. 1 shows an illustration explaining a concavo-convex structure formed by spherical particles.

Next, detailed explanation will be made of materials or compounds used for carrying out the invention, a light extraction sheet, an organic electroluminescence element, and content or shape of an illumination device employing the element.
<<Light Extraction Sheet>>
[Transparent Resin Film]

The light extraction sheet of the invention comprises a transparent resin film and provided thereon, a light scatter layer and a concavo-convex layer.

In the invention, the transparent resin film preferably employed is not particularly limited, and material, shape, structure or thickness thereof may be appropriately selected from those known in the art. Examples of the transparent resin film include a polyester resin film such as a polyethylene terephthalate (PET) film, a polyethylene naphthalate film or a modified polyester film; a polyolefin resin film such as a polyethylene (PE) film, a polypropylene (PP) film, a polystyrene film, or a cycloolefin resin film; a vinyl resin film such as a polyvinyl chloride film or a polyvinylidene chloride film; a polyether ether ketone (PEEK) resin film; a polysulfone (PSF) resin film; a polyethersulfone (PES) resin film; a polycarbonate (PC) resin film; a polyamide resin film; a polyimide resin film; an acryl resin film and a triacetyl cellulose (TAC) resin film. A resin film having a transmittance of 80% or more in the visible wavelength region (380-780 nm) is preferably applicable as the transparent resin film in the present invention. Among these, a biaxially-oriented polyethylene terephthalate film, a biaxially-oriented polyethylene naphthalate film, a polyethersulfone film or a polycarbonate film is preferred from a viewpoint of transparency, heat resistance, easy handling, strength and cost, and a biaxially-oriented polyethylene terephthalate film or a biaxially-oriented polyethylene naphthalate film is more preferred.

In the invention, the refractive index of the transparent resin film is preferably not less than 1.50, and more preferably from 1.60 to 1.80.

In the invention, the thickness of the transparent resin film is preferably from 50 to 250 μm, and more preferably from 75 to 200 μm.

In order to secure the wettability and adhesion property of a coating solution, the transparent resin film employed in the present invention can be subjected to surface treatment or provided with an easy adhesion layer. A well-known technique can be used with respect to the surface treatment or the easy adhesion layer. Examples of the surface treatment include surface activating treatment such as corona discharge treatment, flame treatment, ultraviolet treatment, high-frequency wave treatment, glow discharge process, activated plasma treatment or laser treatment.

As the easy adhesion layer, there is mentioned a layer containing polyester, polyamide, polyurethane, a vinyl copolymer, a butadiene copolymer, an acryl copolymer, a vinylidene copolymer, an epoxy copolymer or the like. The easy adhesion layer may be a single layer or may be two or more layers thereof in order to increase adhesion property.

[Binder Resin]

Tire light extraction sheet of the invention comprises a transparent resin film and provided thereon, a light scatter layer containing a binder resin and light scattering particles dispersed in the binder resin and a concavo-convex layer containing a binder resin and spherical particles.

The binder resin used in the light scatter layer and concavo-convex layer of the light scatter sheet of the invention, although not specifically limited, is preferably a curable resin in view of the cost or convenience in the layer formation. The curable resin used in the invention is one which is capable of being cured by any of ultraviolet ray irradiation, electron beam irradiation and heat treatment, and is not specifically limited as long as after it is mixed with inorganic particles, the mixture is cured to provide a transparent resin composition. Examples of the binder resin include a silicone resin, an epoxy resin, a vinyl ester resin, an acryl resin and an allyl ester resin. The curable resin may be an actinic ray curable resin to be cured by mediation of ultraviolet rays or electron beams or a heat curable resin to be cured by heat treatment. For example, various acryl resins as listed below can be preferably employed.

<Acryl Resins>

As material components for acryl resins, there are monofunctional monomers such as mentioned ethyl (meth)acrylate, ethyl hexyl (meth)acrylate, styrene, methylstyrene, fluorene acrylate and N-vinylpyrrolidone; and multifunctional monomers such as urethane (meth)acrylate, polyester (meth)acrylate, polymethylolpropane tri(meth)acrylate, hexane diol (meth)acrylate, polyethylene glycol di(meth) acrylate, tripropylene glycol di(meth)acrylate, diethylene glycol di(meth)acrylate, pentaerythritol tri(meth)acrylate, dipentaerythritol hexa(meth)acrylate, 1,6-hexanediol di(meth)acrylate, neopentyl glycol di(meth)acrylate and isocyanuric acid modified di(or tri)acrylate.

In the invention, multifunctional acrylate compounds having three or more functional groups or multifunctional urethane compounds having three or more functional groups among these are preferably used.

[Light Scattering Particles]

The light extraction sheet of the invention comprises a transparent resin film and provided thereon, a light scatter layer containing a hinder resin and light scattering particles dispersed in the binder resin.

The light scattering particles in the invention are those having a function capable of multiply scattering light entering the light scatter layer. In the invention, the average particle size of the light scattering particles is preferably from 0.2 to 1.0 μm, showing effective scatter to light having luminous intensity distribution characteristic different due to an emission wavelength. The average particle size of the light scattering particles of not less than 0.2 μm shows a great effect since it provides scatter light with high intensity at all the wavelengths, and the average particle size of the light scattering' particles of not more than 1.0 μm provides low scattering intensity at all the wavelengths. This enables effective use of luminous intensity distribution characteristic differing due to a different emission wavelength and therefore enables obtaining desired results. In the invention, the luminous intensity distribution characteristic in the light emission layer is such that when luminous intensity of a short wavelength light in an oblique direction is higher, chromaticity or luminous intensity at the observation angle can be uniformed by scattering a blue light more strongly, and therefore, the average particle size of the light scattering particles is especially preferably from 0.3 to 0.7 μm.

The average particle size herein referred to means a volume based average of diameters (sphere equivalent particle diameters) of spheres each having the same volume as each of the particles. The average particle size can be obtained measuring a particle dispersion solution according to a particle size measuring apparatus (for example, Zeta Sizer Nano-S, produced by Malvern Co., Ltd.) according to a generally known dynamic light scatter system and the like.

The refractive index of the light scattering particles is preferably not less mart 1.6, and the upper limit of the refractive index is determined according to a matrix resin material to be added. The refractive index difference between the light scattering particles and the matrix resin material to be added of not less than 0.01 is preferred in obtaining a light scattering property, and that of not more than, 1.5 is preferred in maintaining the transparency. It is especially preferred in utilizing the difference due to the wavelength of scattering intensity that the refractive index difference between the light scattering particles and the matrix resin material is from 0.2 to 0.7.

As the light scattering particles used in the invention, known particles composed of inorganic compounds or polymers can be employed. Examples of the inorganic compound particles include particles of inorganic oxides such as silicon dioxide (silica), titanium dioxide, aluminum oxide, zirconium oxide, calcium carbonate, talc, clay, calcined kaolin, calcined calcium silicate, calcium silicate hydrate, aluminum silicate, magnesium silicate or calcium phosphate. Examples of the polymer particles include those of silicone resin, fluorine resin or acrylic resin. Among these, particles of inorganic oxides such as aluminum oxide and zirconium oxide are preferred as the light scattering particles used in the invention, in view of a difference in refractive index between them and matrix resin materials used. The addition amount of these light scattering particles is preferably from 10 to 40% by volume, and it can be adjusted to be in accordance with a desired degree of light scattering property.

These light scattering particles may be in any form such as spherical form, needless form or tabular form. Further, the light scattering particles are subjected to surface treatment, which can improve the dispersibility in the resin.

The thickness of the light, scatter layer in the invention is not restricted as long as the effect is exerted that light extraction efficiency and angle dependency of chromaticity or luminous intensity is improved by the light scattering particles, and is preferably from 1 μm to about 10 μm and more preferably from 3 to 8 μm.

The light scatter layer in the invention is provided on at least one side of the transparent resin film. The light scatter layer is provided on the light input side surface of the transparent resin film, on the light output side surface of the transparent resin film, or on the both sides of the transparent resin film. When the light scatter layer is provided on the both sides of the transparent resin film, it is preferred that the addition amount of the light scattering particles is properly adjusted so that the scattering intensity due to the both light scatter layers does not excessively increase. When the light scatter layer is provided only on the one side of the transparent resin film, it is preferred that a resin layer containing no light scattering particles is formed on the surface of the transparent resin film, opposite the light scatter layer so that the phenomenon that when handled as a transparent substrate, the one side surface thereof is curved, so-called curling does not occur. Further, a layer which functions as a barrier coat layer or a hard coat layer can be provided. It is preferred that the resin yet containing no light, scattering particles has a refractive index identical to lower than that of the transparent resin film, since a large difference in refractive index between the transparent resin film and the resin layer causes deterioration of light extraction due to reflection at the interface.

[Formation of Light Scatter Layer]

The light scatter layer used in the light extraction sheet of the invention is formed on a transparent resin film by means of a coating method and the like. As examples of the coating method, there are mentioned known methods such as a gravure coating method, a dip coating method, a reverse coating method, a wire bar coating method, a the coating method, and an ink-jet method.

The light scatter layer can be formed according to a method such as curing via ultraviolet rays or heat, layer formation via drying, or curing via chemical reaction. When an ultraviolet ray curable resin is employed in the light scatter layer, the ultraviolet ray curable resin layer can be cured by light curing reaction. A light source for curing the ultraviolet ray curable resin layer is not limited as long as it is one emitting ultraviolet rays. For example, a low pressure mercury lamp, a medium pressure mercury lamp, a high pressure mercury lamp, an ultrahigh pressure mercury lamp, a carbon arc lamp, a metal halide lamp and a xenon lamp can be utilized. The irradiation condition may differ depending on each lamp, and the irradiation quantity of actinic rays is ordinarily from 5 to 500 mJ/cm$^2$, preferably from 5 to 150 mJ/cm$^2$, and more preferably from 20 to 100 mJ/cm$^2$.

[Spherical Particles]

The spherical particles used in the concavo-convex layer in the invention have an average particle size of from 3 to 10 μm.

The surface of the concavo-convex layer forms a hemisphere-shaped concavo-convex structure in which not less than ¼, and preferably not less than ½ of the surfaces of the spherical particles protrude from the layer surface. The average particle size refers to a volume based average of the sphere equivalent particle diameters, like that of the light scattering particles in the light scatter layer described above, and can be determined employing a particle size measuring apparatus according to a dynamic light scatter system and the like. The average particle size can be determined by measuring the particle sizes of 300 or more particles in an SEM photograph of the cross-section of the concavo-convex layer.

The spherical particles referred to in the invention are spherical particles having a degree of sphericity of from 0.5 to 5%, and preferably from 1 to 2%. The degree of sphericity a ratio of a sphericity obtained by being measured according to a method described later and a diameter of the particles, and is represented by the following formula Degree of Sphericity (%)=($D$max−$D$min)/(2×$D$max)× 100 wherein Dmax represents the maximum of the diameters of the circumscribed circles of the spherical particles; and Dmin represents the minimum of the diameters of the inscribed circles of the spherical particles.

The sphericity can be measured by a method according to a sphericity measurement method as specified in JIS B 1501. There is a method which measures, through a sphericity measuring device, the particle perimeter of the surface of the particles on the two or three equatorial planes perpendicular to each other, or a method which obtains a particle image by photographing the particles by an electron microscope, then inserting the perimeter of one equatorial plane of the resulting particle image between the two geometrical circles having the gravity of the particle as the center to obtain a circumscribed circle and an inscribed circle of the particle, and measuring the diameter of the circumscribed circle and the inscribed circle.

As the spherical particles in the invention, known inorganic compound particles or polymer particles can be employed. Examples of the inorganic compound include silicon dioxide (silica), aluminum oxide, zirconium oxide, calcium carbonate, and the like. Examples of the polymer include a silicone resin, a fluorine contained resin, an acryl resin and tire like. Among these, a material for the light scattering particles used in the invention is preferably silica or polymethyl methacrylate (PMMA) resin, in view of difference in the refractive index between the light scattering particles and matrix resin materials used.

[Formation of Concavo-Convex Layer]

The concavo-convex layer in the invention can be formed on a transparent resin film by means of a coating method and the like, the spherical particle content of the coating solution or the coating layer thickness being controlled. As examples of the coating method, there are mentioned known methods such as a gravure coating method, a dip coating method, a reverse coating method, a wire bar coating method, a the coating method, and an ink-jet method.

Figure 2:
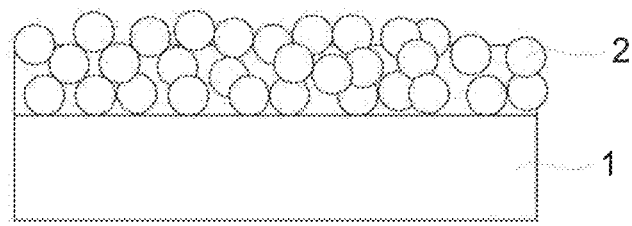
FIG. 2 shows an illustration explaining a concavo-convex structure in which not less than ½of the surface of a layer formed of a plurality of spherical particles to be stacked one on top of another protrude from the layer surface.

The present invention is featured in that a concavo-convex structure is formed by spherical particles dispersed in the coating solution. In the invention, the concavo-convex structure formed by the spherical particles is a concavo-convex structure deriving from particle shape formed by causing a part of spherical particles 2 to protrude from the average surface of the concavo-convex layer on the transparent resin film 1, and is a hemisphere-shaped concavo-convex structure in which not less than ¼, preferably not less than ½ of the surfaces of the spherical particles protrude from the layer surface. For example, the concavo-convex structure as shown in FIG. 1 is preferred. Further, the concavo-convex structure as shown in FIG. 2 is preferred which is formed by a plurality of spherical particles to be stacked one on top of another so that not less than ½ of the surfaces of the spherical particles protrude from the layer surface. In the invention, the surface of the spherical particles for forming the concave-convex structure may or may not be covered with a resin, however, the spherical particles covered with a thin resin layer is preferred in view of prevention of the separation from the layer or the surface strength. The resin layer thickness of the resin-covered spherical particles is preferably less than 1 µm in that a curved surface shape derived from the spherical particles is formed.

In the invention, it is preferred that the surface of the concavo-convex layer in the invention form a curved surface shape derived from the spherical particles. The rate at which the smooth surface is occupied in the entire surface of the light extraction sheet of the invention is preferably 10% or less, and more preferably 5% or less. The maximum distance from the convex portion to the concavo portion in the concavo-convex layer of the invention is preferably from 1 to 10 µm, and more preferably from 2 to 7 µm, although it depends on the spherical particles used.

In the invention, in the formation of the concavo-convex layer employing the spherical particles an intended concavo-convex layer can be formed by controlling the spherical particle content of the coating solution or the wet layer thickness during coating. In the invention, the content of the spherical particles in the concavo-convex layer is preferably from 20 to 70% by volume, and more preferably from 30 to 50% by volume, in order to form a concavo-convex layer in which the spherical particles properly protrude from the layer surface as described above. When the wet layer thickness during coating is less man the particle size of the spherical particles, it causes coating fault of separation of the particles from the formed layer, while when the wet layer thickness during coating is over three times of the particle size of the spherical particles, it does not form an intended concavo-convex structure, since a part of the spherical particles excessively stacks. Therefore, the wet layer thickness during coating is preferably from 1.0 to 3.0 times of the average particle size of the spherical particles and more preferably from 1.2 to 2.5 times of the average particle size of the spherical particles.

The concavo-convex layer in the invention can be formed according to a method such as curing via ultraviolet rays or heat, layer formation via drying, or curing via chemical reaction. When an ultraviolet ray curable resin is employed in the concavo-convex layer, the ultraviolet ray curable resin layer can be cured by light curing reaction. A light source for curing the ultraviolet ray curable resin layer is not limited as long as it is one emitting ultraviolet rays. For example, a low pressure mercury lamp, a medium pressure mercury lamp, a high pressure mercury lamp, an ultrahigh pressure mercury lamp, a carbon arc lamp, a metal halide lamp and a xenon lamp can be utilized. The irradiation condition may differ depending on each lamp, and the irradiation quantity of actinic rays is ordinarily from 5 to 500 mJ/cm$^2$, preferably from 5 to 150 mJ/cm$^2$, and more preferably from 20 to 100 mJ/cm$^2$.

The light extraction sheet of the invention is featured in that it comprises a concavo-convex layer as well as the light scatter layer as described above. The concavo-convex layer in the invention is preferably formed on the light output side surface of the sheet. The concavo-convex layer may be formed on the surface of a transparent resin film with a light scatter layer formed thereon opposite the light scatter layer or superposed on tire scatter layer. When the concavo-convex layer is formed on the light scatter layer of the transparent resin film, it is preferred that the concavo-convex layer be formed on the surface of the transparent resin film opposite the light scatter layer, since there is possibility that the concavo-convex structure formed on the sheet surface is affected by minute irregularity produced on the light scatter layer surface to produce disorder in the concavo-convex structure.

The light extraction sheet of the invention can contain a pigment or a dye as a color tone adjusting agent. The color tone adjusting agent can be added to the light scatter layer or concavo-convex layer as described above, a newly formed layer or a transparent substrate.

[Haze, Transmittance]

It is preferred in the invention that both haze and total optical transmittance of the light extraction sheet of the invention are high. It is preferred in the light extraction sheet that the haze is not less than 98% and the total optical transmittance is not less than 65%. It is more preferred in the light extraction sheet feat the haze is not less than 98.3% and the total optical transmittance is not less than 70%. Haze and total optical transmittance can be measured by a method according to the standard specified in ISO 13468 and ISO 14782, employing a known haze meter or the like. For example, a haze meter NDH 5000 manufactured by Nippon Denshoku Industries, Co., Ltd, can be employed as the haze meter.

In the light extraction sheet of the invention, when the total thickness of the sheet including the light scatter layer, the concavo-convex layer and the transparent resin film each described above is not less than 50 µm, the light scattering effect is satisfactory and the layer strength is high, while when the total thickness is not more than 1000 µm, flexibility of the element is high. Therefore, the total thickness of the sheet is preferably from 50 to 1000 µm, and more preferably from 100 to 500 µm, The light extraction sheet of the invention can be arranged at a position between a surface emitter as a light source and the surface of an object on which the emitted light falls. As the light source, an LED, an inorganic EL element or an organic EL element can be employed, and an organic EL element is especially preferably employed.

<<Organic EL Element>>

Next, detailed explanation will be made of an embodiment of the organic EL element and illumination device of the invention. However, the content as described below is a representative example of the embodiment of the invention, and the present invention is not limited thereto in a range within the scope thereof.

[Transparent Substrate]

The transparent substrate employed for the organic EL element of the invention is not particularly limited as long as it exhibits high light transmission property. For example, a glass substrate, a resin substrate, and a resin film are suitably used in view of their high hardness and the ease with which a layer can be formed on their surfaces. A transparent resin film is preferably employed in view of low weight and high flexibility.

In the invention, the transparent film preferably employed for the transparent substrate is not particularly limited, and can be selected from the same as described previously in the transparent resin film used for the light extraction sheet. Among these, a biaxially-oriented polyethylene terephthalate film, a biaxially-oriented polyethylene naphthalate film, a polyethersulfone film or a polycarbonate film is preferred from a viewpoint of transparency, heat resistance, easy handling, strength and cost, and a biaxially-oriented polyethylene terephthalate film or a biaxially-oriented polyethylene naphthalate film is more preferred.

In the invention, the refractive index of the transparent substrate is preferably not less than 1.50, and more preferably from 1.60 to 1.80.

In the invention, the thickness of the transparent substrate is preferably from 50 to 250 μm, and more preferably from 75 to 200 μm.

In order to secure the wettability and adhesion property of a coating solution, the transparent substrate employed in the present invention can be subjected to surface treatment or provided with an easy adhesion layer. A well-known technique can be used with respect to the surface treatment or the easy adhesion layer. Examples of the surface treatment include surface activating treatment such as corona discharge treatment, flame treatment, ultraviolet treatment, high-frequency wave treatment, glow discharge process, activated plasma treatment or laser treatment.

As the easy adhesion layer, there is mentioned a layer containing polyester, polyamide, polyurethane, a vinyl copolymer, a butadiene copolymer, an acryl copolymer, a vinylidene copolymer, an epoxy copolymer or the like. The easy adhesion layer may be a single layer or may be two or more layers thereof in order to increase adhesion property.

[Organic Electroluminescence Layer]

The organic EL element of the invention is featured in that a transparent electrically conductive layer, an organic electroluminescence layer comprising an electron transporting layer and a counter electrode are formed on a transparent substrate in that order, and a light extraction sheet is formed on the light output surface of the transparent substrate so that the concavo-convex layer of the sheet faces the light output surface.

The organic electroluminescence layer herein referred to implies a layer, which is composed of all or a part of an anode buffering layer, a hole unsporting layer, a light emission layer, a hole blocking layer, an electron transporting layer and a cathode buffering layer and which is provided between a transparent electrically conductive layer and a cathode.

The refractive index of the organic electroluminescence layer in the invention, although different due to the constitution materials, is ordinarily about 1.7. The thickness of the organic electroluminescence layer is ordinarily from 0.05 to 0.5 μm, in view of emission efficiency and stability, and is preferably from 0.1 to 0.2 μm.

In the invention, the thickness of the electron transporting layer in the organic electroluminescence layer is preferably from 40 to 200 nm, in view of improving the light extraction efficiency.

It is known that the luminous intensify characteristic of the organic electroluminescence layer varies with change in the thickness of the electron transporting layer in the organic electroluminescence layer. For example, in the same organic EL element as in the invention, emitting a white light employing a combination of three colors of red, green and blue or another combination in the light emission layer, luminous intensity of light with each different wavelength or luminous intensity of light depending on the output angle can be changed by adjustment of the electron transporting layer thickness.

In the invention, with respect to the ratio of luminous intensity from the direction inclined by an appropriate angle from the direction perpendicular to the transparent to substrate to that from the direction perpendicular to the transparent substrate, the ratio in a blue color is preferably larger that that in a red color or a green color. In order to obtain such a luminous intensity distribution characteristic, the thickness of the electron transporting layer is preferably from 40 to 200 nm, and more preferably from 50 to 100 nm. Herein, when the electron transporting layer thickness is not less than 40 nm, it is preferred, since luminous intensity distribution of each color is not uniformed and particularly, extraction efficiency of a blue color light whose luminous intensity is low does not deteriorate. Further, when the electron transporting layer thickness is not more than 200 nm, it is preferred, since luminous intensity distribution of light with a different wavelength is not uniformed, and since emission efficiency does not deteriorate, as the interval between the transparent electrically conductive layer and the emission point is not long.

With respect to the luminous intensity distribution characteristic as described above, when light is observed which is emitted from the organic electroluminescence layer prepared employing a smooth transparent substrate which does not cause scatter of light, it is confirmed that luminous intensity or chromaticity of the output light varies depending on the angle of the observation.

[Measurement Method of Layer Thickness]

In the invention, the thickness of each layer constituting the organic EL element can be measured by an ordinary method. For example, the section of the organic EL element prepared by lamination of each layer is photographed by means of a scanning electron microscope, the thickness of each layer is measured from the photographed section.

<<Transparent Electrically Conductive Layer>>

For the transparent electrically conductive layer of the organic EL element of the invention, a metal, an alloy, or an electroconductive compound each having a high working function (not less than 4 eV), and mixture thereof are preferably used as the electrode material terming the transparent electrically conductive layer. Typical examples of such an electrode material include a metal such as Au, and a transparent electroconductive and light transmissive material such as CuI, indium tin oxide (ITO), $SnO_2$ or ZnO. A material such as IDIXO ($In_2O_3$—ZnO), which is amorphous and capable of forming an electrically conductive film may be used. In the invention, the transparent electrically conductive layer is preferably employed as an anode. The anode may be prepared by forming a thin layer of the electrode material according to a depositing or sputtering method, and by forming the layer into a desired pattern according to a photolithographic method. When required precision of the pattern is not so high (not less than 100 μm), the pattern may be formed by depositing or sputtering of the electrode material through a mask having a desired form. When a coatable material such as an organic conductive compound is used, a wet coating method such as a printing method or a coating method can be used. When light is emitted through the anode, the transmittance of the anode is preferably 10% or more, and the sheet resistance of the anode is preferably not more than several hundreds Ω/□. The thickness of the layer is ordinarily within the range of from 10 μm to 1000 nm, and preferably from 50 nm to 200 nm, although it may vary due to kinds of materials used.

Further, it is possible to add to the transparent electrically conductive layer another resin having a high electrical conductivity and a relatively low refractive index, and it is preferred to add to the transparent electrically conductive layer metal nanowires whereby improvement of light extraction efficiency due to the light scattering effect is expected. The metal nanowires are preferably used in the transparent electrically conductive layer, since the strength of the transparent electrically conductive layer is increased due to their network structure, and further, durability of the organic EL element is increased.

In the invention, when the metal nanowires are employed, the average length of the metal nanowires is preferably 3 μm or more, more preferably from 3 to 500 μm, and still more preferably from 3 to 300 μm, in order to form a long conductive path by one metal nanowire and to realize an appropriate light scattering property. In addition, the relative standard deviation of the length of the metal nanowires is preferably 40% or less. Further, a smaller average diameter is preferred from a viewpoint of transparency, and a larger average diameter is preferred from a conductive viewpoint. In the present invention, the average diameter of the metal nanowires is preferably from 10 to 300 nm, and more preferably 30 to 200 nm. Furthermore, the relative standard deviation of the diameter is preferably 20% or less.

A metal composition of the metal nanowires in the invention is not specifically limited, and can be composed of one or two or more kinds of noble metal elements or base metal elements. It is preferred that the composition contains at least one kind of a metal selected from the group consisting of noble metals (for example, gold, platinum, silver, palladium, rhodium, iridium, ruthenium and osmium), iron, cobalt, copper and tin. It is more preferred that the composition contains at least silver from a conductive viewpoint.

Moreover, for the purpose of achieving compatibility of conductivity and stability (sulfuration resistance, oxidation resistance and migration resistance of the metal nanowires), it is preferred that the composition contains silver and at least one kind of a metal belonging to the noble metals except silver. When the metal nanowires of the present invention contain two or more kinds of metallic elements, the metal composition of the metal nanowires may be different between the surface and the inside thereof, and the entire metal nanowires may have the same metal composition.

The manufacturing method of Ag nanowires may be referred to Adv. Mater., 2002, 14, 833-837 and Chem. Mater., 2002, 14, 4736-4745; a manufacturing method of Au nanowires may be referred to Japanese Patent O.P.I. Publication No. 2006-233252; a manufacturing method of Cu nanowires may be referred to Japanese Patent O.P.I. Publication. No. 2002-266007; and a manufacturing method of Co nanowires may be referred to Japanese Patent O.P.I. Publication No. 2004-149871. Specifically, the manufacturing methods of Ag nanowires, described in the aforementioned Adv. Mater, and Chem. Mater., may be preferably employed as a manufacturing method of the metal nanowires in the present invention, since a large amount of Ag nanowires can be easily manufactured in an aqueous system and the electrical conductivity of silver is highest of all metals.

In the invention, the metal nanowires are brought into contact with each other to form a three dimensional conductive network which realizes high electrical conductivity, and the window portion in the conductive network where the metal nanowires do not exist enables transmission of light. It is possible to extract efficiently light from the organic light emission layer section due to the properties described above and the scattering effect of the metal nanowires. An embodiment in which the metal nanowires are contained in a portion of the electrode close to the organic light emission layer section can utilize more efficiently the scattering effect, which is a preferred embodiment.

The addition of the metal nanowires makes it to form an electrode with high electric conductivity according to a coating method. Therefore, even when concavity and convexity due to particles exist on the surface of an organic-inorganic hybrid material layer, the concavity and convexity are absorbed, which can eliminate the possibility of causing damage to a light emission layer.

The refractive index of the transparent electrically conductive layer is preferably from 1.5 to 2.0, and more preferably from 1.6 to 1.9.

In the invention, when the refractive index or thickness of the transparent electrically conductive layer, an organic electroluminescence element and transparent resin film is optimized as described above, it not only improves light extraction efficiency known in the art but also greatly improves physical film properties of an organic EL element having a minute film structure.

[Organic EL Element]

Preferred embodiments of the layer constitution of the organic EL element will be shown below.
(i): Anode/Light emission layer/Electron transporting layer/Cathode
(ii): Anode/Hole transporting layer/Light emission layer/Electron transporting layer/Cathode
(iii): Anode/Hole transporting layer/Light emission layer/Hole blocking layer/Electron transporting layer/Cathode
(iv): Anode/Hole transporting layer/Light emission layer/Hole blocking layer/Electron transporting layer/Cathode buffering layer/Cathode
(v): Anode/Anode buffering layer/Hole transporting layer/light emission layer/Hole blocking layer/Electron transporting layer/Cathode buffering layer/Cathode Herein, it is preferred that the light emission layer contain at least two kinds of light emission materials emitting a different color light, and the light emission layer may be a single layer or a light emission layer unit composed of a plurality of light emission layers. The hole transporting layer comprises a hole injecting layer or an electron blocking layer.

<<Light Emission Layer>>

The light emission layer in the invention is a layer where electrons and holes, which are injected from electrodes, an electron transporting layer or a hole transporting layer, are recombined to emit light. The portions where light emits may be in the light emission layer or at the interface between the light emission layer and the layer adjacent thereto.

The light emission layer in the invention is not specifically limited to the constitution as long as light emission materials contained therein satisfy the above-described conditions.

A plurality of layers which have the same emission spectra and the same emission maximum wavelength may be formed.

A non-luminescent intermediate layer is preferably provided between the two of the light emission layers.

The total thickness of the light emission layer in the invention is preferably from 1 to 100 nm, and more preferably not more than 30 nm, in view of securing a lower driving voltage. Herein, the total thickness of the light emission layer referred to in the invention, when a non-luminescent intermediate layer is provided between the light emission layers, implies one including the thickness of the non-luminescent intermediate layer.

The thickness of each light emission layer is adjusted to be in the range of preferably from 1 nm to 50 nm, and more preferably from 1 nm to 20 nm. The relationship in thickness between each of a blue light emission layer, a green light emission layer and a red light emission layer is not specifically limited.

With respect to the preparation of the light emission layer, the light emission layer is formed from light emission materials or host compound described later by means of a known film formation, method such as a vacuum deposition method, a spin coating method, a casting method, an LB method or an ink-jet method.

In the invention, each light emission layer may contain a mixture of a plurality of light emission materials or a mixture of phosphorescence emission materials and fluorescence emission materials may be contained in the same light emission layer.

In the invention, it is preferred that the light emission layer contain a host compound and a light emission material (also referred to as an emission dopant) and light be emitted from the light emission material.

The host compound contained in the light emission, layer of the organic EL element of the invention is preferably a compound which has a phosphorescence quantum yield at room temperature (at 25° C.) of less than 0.1. The phosphorescence quantum yield of the host compound is more preferably less than 0.01. The content of the host compound in the light emission layer is preferably not less than 50% by volume.

As the host compound, known host compounds may be used singly or as an admixture of two or more kinds thereof. Use of a plurality of host compounds can adjust charge transfer, and obtain an organic EL element with high efficiency. Further, use of a plurality of light emission materials described later can mix lights with a different color, and can emit light with any color.

The host compound used in the invention may be a conventional low molecular weight compound, a polymeric compound having a repeating unit or one or more kinds of a low molecular weight compound (vapor-polymerizable light emission host) with a polymerizable group such as a vinyl group or an epoxy group.

The known host compound is preferably a compound which has a hole transporting capability and an electron transporting capability, prevents shift of a wavelength of emission light to longer wavelength, and has a high Tg (glass transition temperature). Herein, the glass transition temperature (Tg) is a value which is determined according to the method specified in JIS K 7121, employing DSC (Differential Scanning Colorimetry).

Typical examples of the known host compounds include those described in the following documents.

For example, there are mentioned Japanese Patent O.P.I. Publication Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837.

Next, the light emission material will be explained.

A fluorescence emission material or a phosphorescence emission material (also referred to as a phosphorescent compound or a phosphorescence emitting compound) can be used as the light emission material in the invention.

The phosphorescence emission material in the invention is a compound which emits light from the excitation triplet, can emit phosphorescence at room temperature (25° C.), and has a phosphorescent quantum yield at 25° C. of not less than 0.01. The phosphorescent quantum yield at 25° C. is preferably not less than 0.1.

The phosphorescent quantum yield can be measured according to a method described in the fourth edition "Jikken Kagaku Koza 7", Bunko II, page 398 (1992) published by Maruzen. The phosphorescent, quantum yield can be measured in a solution employing various kinds of solvents. The phosphorescence emission material in the invention is a compound, in which the phosphorescent quantum yield measured employing any one of the solvents satisfies the above-described definition (not less than 0.01).

The light emission of the phosphorescence emission material is divided in two types in principle, one is an energy transfer type in which recombination of a carrier occurs on the host compound to which the carrier is transported to excite the host compound, the resulting energy is transferred to the phosphorescence emission material, and light is emitted from the phosphorescence emission material, and the other is a carrier trap type in which recombination of a carrier occurs on the phosphorescence emission material, which is a carrier trap material, and light is emitted from the phosphorescence emission material. However, in each type, it is necessary that the energy level of a phosphorescence emission material in an excited state is lower than that of the host compound in an excited state.

The phosphorescence emission material can be suitably selected from known ones used in the light emission layer of an organic EL element. The phosphorescence emission material in the invention is preferably a complex compound containing a metal belonging to groups 8 to 10 on the periodic table, and is more preferably an iridium compound, an osmium compound, a platinum compound (a platinum complex) or a rare earth complex, and most preferably an iridium compound.

A fluorescence emission compound can be used in the organic EL element of the invention. Typical examples of the fluorescence emission compound (fluorescent dopant) include a coumarin dye, a pyrane dye, a cyanine dye, a croconium dye, a squarylium dye, an oxobenzanthracene dye, a fluorescein dye, a rhodamine dye, a pyrylium dye, a perylene dye, a stilbene dye, a polythiophene dye and a rare earth complex type fluorescent compound.

Commonly known dopants can be employed in the invention, and examples thereof include those described, for example, in WO 00/70655, Japanese Patent O.P.I. Publication No. 2002-280178, Japanese Patent O.P.I. Publication No. 2001-181616, Japanese Patent O.P.I Publication No. 2002-280179, Japanese Patent O.P.I. Publication No. 2001-181617, Japanese Patent O.P.I. Publication No. 2002-280180, Japanese Patent O.P.I, Publication No. 2001-247859, Japanese Patent O.P.I. Publication No. 2002-299060, Japanese Patent O.P.I. Publication No. 2001-313178, Japanese Patent O.P.I. Publication No. 2002-302671, Japanese Patent O.P.I. Publication No. 2001-345183, Japanese Patent O.P.I. Publication No. 2002-324679, WO 02/15645, Japanese Patent O.P.I. Publication No. 2002-332291, Japanese Patent O.P.I. Publication No. 2002-50484, Japanese Patent O.P.I. Publication No. 2002-

322292, Japanese Patent O.P.I. Publication No. 2002-83684, Japanese Patent O.P.I. Publication No. 2002-540572, Japanese Patent O.P.I. Publication No. 2002-117978, Japanese Patent O.P.I. Publication No. 2002-338588, Japanese Patent O.P.I. Publication No. 2002-170684, Japanese Patent O.P.I. Publication No. 2002-352960, WO 01/93642, Japanese Patent O.P.I. Publication No, 2002-50483, Japanese Patent O.P.I. Publication No. 2002-100476, Japanese Patent O.P.I. Publication No. 2002-173674, Japanese Patent O.P.I. Publication. No. 2002-359082, Japanese Patent O.P.I. Publication No. 2002-175884, Japanese Patent O.P.I. Publication No. 2002-363552, Japanese Patent O.P.I. Publication No. 2002-184582, Japanese Patent O.P.I. Publication No. 2003-7469, Japanese Patent O.P.I. Publication No. 2002-525808, Japanese Patent O.P.I. Publication No. 2003-7471, Japanese Patent O.P.I. Publication No. 2002-525833, Japanese Patent. O.P.I. Publication No. 2003-31366, Japanese Patent O.P.I. Publication No. 2002-226495, Japanese Patent O.P.I. Publication No. 2002-234894, Japanese Patent O.P.I. Publication No. 2002-235076, Japanese Patent O.P.I. Publication No. 2002-241751, Japanese Patent O.P.I. Publication No. 2001-319779, Japanese Patent O.P.I. Publication No. 2001-319780, Japanese Patent O.P.I. Publication No. 2002-62824, Japanese Patent O.P.I. Publication No. 2002-100474, Japanese Patent O.P.I. Publication No. 2002-203679, Japanese Patent O.P.I. Publication No. 2002-343572, and Japanese Patent O.P.I. Publication No. 2002-203678.

In the invention, two or more kinds of light emission materials may be attained in at least one light emission layer, and the concentration rate of the light emission materials in the light emission layer may be changed in the thickness direction of the light emission layer.

<<Intermediate Layer>>

In the invention, explanation will be made of a non-luminescent intermediate layer (also referred to as a non-doped region) provided between the light emission layers.

The non-luminescent intermediate layer, when there are a plurality of light emission layers, is a layer provided between the light emission layers.

The thickness of the non-luminescent intermediate layer is within the range of preferably from 1 to 20 nm. Further, the thickness is within the range of more preferably from 3 to 10 nm, from the viewpoints of suppressing interaction such as energy transfer between the light emission layers adjacent to each other and of placing no significant burden on current voltage characteristics of the element.

Materials used in the non-luminescent intermediate layer may be the same as or different from host compounds used in the light emission layer, and are preferably the same as the host materials used in at least one of the two light emission layers adjacent to the non-luminescent intermediate layer.

The non-luminescent intermediate layer may employ common compounds (for example, host compounds) with another non-luminescent intermediate layer or light emission layers. The content of the common host materials in the non-luminescent intermediate layer shows the effects that interlayer injection barrier between the light emission layer and the non-luminescent intermediate layer is reduced and injection balance of holes or electrons is easily maintained even when voltage (electric current) is changed. (Herein, use of the common host materials refers to a case where the physical and chemical properties such as a phosphorescence emission energy and a glass transition point are the same or a case where the chemical structure of the host compounds is the same.) In addition, the use in a non-doped light emission layer of a host material having the same physical properties or the same chemical structure as a host compound used in each light emission layer can eliminate complexity in the manufacture of the element which has been hitherto a big problem.

In the invention, since the host materials transport a carrier, they are preferably materials having a carrier transporting capability. Carrier mobility is employed as a physical property representing the carrier transporting capability. Carrier mobility of organic materials generally depends on electric field intensity. Materials having a high electric field intensity dependency of the mobility are likely to fracture the injection and transport balance of holes and electrons, and therefore, materials having a low electric field intensity dependency of the mobility are preferably used as materials for the intermediate layer or host materials.

Further, in order to adjust optimally the injection balance of holes or electrons, a non-luminescent intermediate layer, which functions as a blocking layer described later, i.e., a hole blocking layer or an electron blocking layer, is a preferred embodiment.

<<Injecting Layer: Electron Injecting Layer, Hole Injecting Layer>>

The injecting layer, for example, an electron injecting layer or a hole injecting layer, is optionally provided, and may be provided between the anode and the light emission layer or hole transporting layer, and between the cathode and the light emission layer or electron transporting layer, as described above.

The injecting layer herein referred to is a layer provided between the electrode and an organic layer in order to reduce tire driving voltage or to improve of light emission efficiency, which is detailed in "Electrode Material", Div. 2 Chapter 2, pp. 123-166 of "Organic EL element and its frontier of industrialization" (published by NTS Corporation, Nov. 30, 1998). As the injecting layer there are a hole injecting layer (an anode buffer layer) and an electron injecting layer (a cathode buffer layer).

The anode buffer layer (hole injecting layer) is described in Japanese Patent O.P.I. Publication Nos. 9-45479, 9-260062, and 8-288069 etc, and its examples include a phythalocyanine buffer layer represented by a copper phthalocyanine layer, an oxide buffer layer represented by a vanadium oxide layer, an amorphous carbon buffer layer, a polymer buffer layer employing an electroconductive polymer such as polyaniline (emeraldine), and polythiophene, etc.

The cathode buffer layer (electron injecting layer) is described in Japanese Patent O.P.I. Publication Nos. 6-325871, 9-17574, and 10-74586, etc, in detail, and its examples include a metal buffer layer represented by a strontium or aluminum layer, an alkali metal compound buffer layer represented by a lithium fluoride layer, an alkali earth metal compound buffer layer represented by a magnesium fluoride layer, and an oxide buffer layer represented by an aluminum oxide. The buffer layer (injecting layer) is preferably very thin and has a thickness of preferably from 0.1 nm to 5 μm depending on kinds of the material used.

<<Blocking Layer: Hole Blocking Layer, Electron Blocking Layer>>

The blocking layer is a layer provided if necessary in addition to the fundamental constituent layer as described above, and is for example a hole blocking layer as described in Japanese Patent O.P.I. Publication Nos. 11-204258, and 11-204359, and on page 237 of "Organic EL element and its frontier of industrialization" (published by NTS Corporation, Nov. 30, 1998), The hole blocking layer is an electron transporting layer in a broad sense, and is comprised of material having an ability of transporting electrons but an extremely poor ability of holes, which can increase a recombination probability of electrons and holes by transporting electrons and blocking holes. Further, the constitution of an electron transporting layer described later can be used in the hole blocking layer in the invention as necessary. The hole blocking layer is preferably provided to be in contact with a light emission layer.

On the other hand, the election blocking layer is a hole transporting layer in a broad sense, and is comprised of material having an ability of transporting holes but an extremely poor ability of electrons, which can increase a recombination probability of electrons and holes by transporting holes and blocking electrons. The constitution of the hole transporting layer as described later can be used as that of the electron blocking layer. The thickness of the hole blocking layer or electron transporting layer is preferably from 3 nm to 100 nm, and more preferably from 5 nm to 30 nm.

<<Hole Transporting Layer>>

The hole transporting layer is comprised of a hole transporting material having an ability of transporting holes, and a hole injecting layer and an electron blocking layer are included in the hole transporting layer in a broad sense. The hole transporting layer may be a single layer or plural layers.

The hole transporting material has a hole injecting ability, a hole transporting ability or an ability to form a barrier to electrons, and may be either an organic substance or an inorganic substance. Examples of thereof include a triazole derivative, an oxadiazole derivative, an imidazole derivative, a polyarylalkane derivative, a pyrazoline derivative and a pyrazolone derivative, a phenylenediamine derivative, an arylamine derivative, an amino substituted chalcone derivative, an oxazole derivative, a styryl anthracene derivative, a fluorenone derivative, a hydrazone derivative, a stilbene derivative, a silazane derivative, an aniline copolymer, and an electroconductive oligomer, particularly a thiophene oligomer.

As the hole transporting material, those described above are used, but a porphyrin compound, an aromatic tertiary amine compound, or a styrylamine compound is preferably used, and an aromatic tertiary amine compound is more preferably used.

Typical examples of the aromatic tertiary amine compound and styrylamine compound include N,N,N',N'-tetraphenyl-4,4'-diaminophenyl, N,N'-diphenyl-N,N'-bis(3-methylphenyl)-[1,1'-biphenyl]-4,4'-diamine (TPD), 2,2'-bis (4-di-p-tolylaminophenyl)propane, 1,1-bis(4-di-p-tolylaminophenyl)cyclohexane, N,N,N',N'-tetra-p-tolyl-4, 4'-diaminobiphenyl, 1,1-bis(4-di-p-tolylaminophenyl)-4-phenylcyclohexane, bis(4-dimethylamino-2-methylphenyl)-phenylmethane, bis(4-di-p-tolylaminophenyl) phenylmethane, N,N'-diphenyl-N,N'-di(4-methoxyphenyl)-4,4'-diaminobiphenyl, N,N,N',N'-tetraphenyl-4,4'-diaminodiphenyl ether, 4,4'-bis(diphenylamino) quardriphenyl, N,N,N-tri(p-tolyl)amine, 4-(di-p-tolylamino)-4'-[4-(di-p-tolylamino)styryl]stilbene, 4-N,N-diphenylamino(2-diphenylvinyl)benzene, 3-methoxy-4'-N, N-diphenylaminostylbenzene, N-phenylcarbazole, compounds described in U.S. Pat. No. 5,061,569 which have two condensed aromatic rings in the molecule thereof such as 4,4'-bis[N-(1-naphthyl)-N-phenylamino]biphenyl (NPD), and compounds described in Japanese Patent O.P.I. Publication No. 4-308688 such as 4,4',4"-tris[N-(3-methylphenyl)-N-phenylamino]-triphenylamine (MTDATA) in which three triphenylamine units are bonded in a starburst form.

A polymer in which the material mentioned above is introduced in the polymer chain or a polymer having the material as the polymer main chain can be also used. As the hole injecting material or the hole transporting material, inorganic compounds such as p-type-Si and p-type-SiC are usable.

So-called p-type hole transporting materials as disclosed in JP-A No. 11-251067 or described in the literature of J. Huang et al. (Applied Physics Letters 80(2002), p. 139) are also applicable. In the present invention, these materials are preferably utilized since an emitting element exhibiting a higher efficiency is obtained.

The hole transporting layer can be formed by layering the hole transporting material by a known method such as a vacuum deposition method, a spin coat method, a casting method, an ink jet method, and an LB method. The thickness of the hole transporting layer is not specifically limited, but is ordinarily from 5 nm to 5 µm, and preferably from 5 to 200 nm. The hole transporting layer may be composed of a single layer structure comprising one or two or more of the materials mentioned above.

A positive hole transporting layer having high p-type property doped with impurity can be utilized. Examples thereof include those described in Japanese Patent O.P.I. Publication Nos. 4-297076, 2000-196140 and 2001-102175, and J. Appl. Phys., 95, 5773 (2004), and so on.

It is preferable in the invention to employ such a positive hole transporting layer having high p-type property, since an element with lower power consumption can be prepared.

<<Electron Transporting Layer>>

The electron transporting layer comprises a material (an electron transporting material) having an electron transporting ability, and in a broad sense refers to an electron injecting layer or a hole blocking layer. The electron transporting layer can be provided as a single layer or plural layers.

An electron transporting material (which serves also as a hole blocking material) used in a single electron transporting layer or in the election transporting layer closest to the cathode of plural electron transporting layers has a function of incorporating electrons injected from a cathode to a light emission layer, and can be selected from known compounds. Examples thereof include a nitro-substituted fluorene derivative, a diphenylquinone derivative, a thiopyran dioxide derivative, a carbodiimide, a fluorenylidenemethane derivative, an anthraquinodimethane, an anthrone derivative, and an oxadiazole derivative. Moreover, a thiadiazole derivative which is formed by substituting the oxygen atom in the oxadiazole ring of the foregoing oxadiazole derivative with a sulfur atom, and a quinoxaline derivative having a quinoxaline ring known as an electron withdrawing group are usable as the electron transporting material. A polymer in which the material mentioned above is introduced in the polymer side chain or a polymer having the material as the polymer main chain can be also used.

A metal complex of an 8-quinolynol derivative such as aluminum tris-(8-quinolynol) ($Alq_3$), aluminum tris-(5,7-dichloro-8-quinolynol), aluminum tris-(5,7-dibromo-8-quinolynol), aluminum tris-(2-methyl-8-quinolynol), aluminum tris-(5-methyl-8-quinolynol), or zinc bis-(8-quinolynol) ($Znq_2$), and a metal complex formed by replacing the central metal of the foregoing complexes with another metal atom such as In, Mg, Cu, Ca, Sn, Ga or Fb, can be used as the electron transporting material. Furthermore, a metal free or metal-containing phthalocyanine, and a derivative thereof, in which the molecular terminal is replaced by a substituent such as an alkyl group or a sulfonic acid group, are also preferably used as the electron transporting material. The distyrylpyrazine derivative exemplified as a material for the light emission layer may preferably be employed as the electron transporting material. An inorganic semiconductor such as n-type-Si and n-type-SiC may also be used as the election transporting material in a similar way as in the hole injecting layer or in the hole transporting layer.

The electron transporting layer can be formed employing the above-described electron transporting materials and a known method such as a vacuum deposition method, a spin coat method, a casting method, a printing method including an ink jet method or an LB method. The electron transporting layer may be composed of a single layer comprising one or two or more kinds of the election transporting material.

An electron transporting layer having high n property doped with impurity can be utilized. Examples thereof include those described in Japanese Patent O.P.I. Publication Nos. 4-297076, 10-270172, 2000-196140, 2001-102175, and J. Appl. Phys, 95, 5773 (2004), and so on.

In the invention, an element with lower power consumption can be prepared by use of such an electron transporting layer having high n property, which is preferred.

<<Counter Electrode>>

The counter electrode in the invention implies an electrode disposed so as to oppose the transparent electrically conductive layer as described above. In the invention, the transparent electrically conductive layer is employed mainly as an anode, and a cathode described later can be employed as the counter electrode. For the cathode, a metal (also referred to as an electron injecting metal), an alloy, and an electroconductive compound each having a low working function (not more than 4 eV), and a mixture thereof is used as the electrode material. Concrete examples of such an electrode material include sodium, sodium-potassium alloy, magnesium, lithium, a magnesium/copper mixture, a magnesium/silver mixture, a magnesium/aluminum mixture, magnesium/indium mixture, an aluminum/aluminum oxide ($Al_2O_3$) mixture, indium, a lithium/aluminum mixture, and a rare-earth metal. Among them, a mixture of an electron injecting metal and a metal higher in the working function than that of the electron injecting metal, such as the magnesium/silver mixture, magnesium/aluminum mixture, magnesium/indium mixture, aluminum/aluminum oxide ($Al_2O_3$) mixture, lithium/aluminum mixture, or aluminum is suitable from the view point of the electron injecting ability and resistance to oxidation. The cathode can be prepared forming a thin layer of such an electrode material by a method such as a deposition or sputtering method. The sheet resistance as the cathode is preferably not more than several hundreds $\Omega/\square$, and the thickness of the layer is ordinarily from 10 nm to 5 μm, and preferably from 50 nm to 200 nm. It is preferred in increasing luminous intensity that either the anode or the cathode of the organic EL element, through which light passes, is transparent or semi-transparent.

After a layer of the metal described above as a cathode is formed to give a thickness of from 1 nm to 20 nm, a layer of the transparent electroconductive material as described in the anode is formed on the resulting metal layer, whereby a transparent or semi-transparent cathode can be prepared. Employing this cathode, an element can be manufactured in which both anode and cathode are transparent.

[Preparation Method of Organic EL Element]

The organic EL element of the invention, can be prepared by providing, on a transparent substrate, an organic-inorganic hybrid material layer, a transparent electrically conductive layer, an organic electroluminescence layer and a counter electrode in that order.

<<Formation of Transparent Electrically Conductive Layer>>

In the invention, a transparent electrically conductive layer is formed on a transparent substrate with a light scatter layer formed thereon, employing an intended electrode material. For example, when ITO (indium oxide doped with tin) is used as the electrode material, a transparent electrically conductive layer can be formed according to vapor deposition or sputtering. A material including metal nanowires, an electrically conductive polymer or a transparent electrically conductive metal oxide is formed into a transparent electrically conductive layer employing a liquid phase film formation method such as a coating method or a printing method.

There is no restriction in particular to the method of forming a layer containing metal nanowires and a conductive polymer or transparent conductive metal oxides on the releasing surface of the releasing substrate a transparent substrate. However, In the invention, it is preferred that the transparent electrically conductive layer is formed according to a liquid phase film forming method such as a coating method or a printing method in view of improvement in productivity or electrode qualities such as smoothness and uniformity, and reduction of environmental load. As the coating method employed can be a roller coating method, a bar coating method, a dip coating method, a spin coating method, a casting method, a die coating method, a blade coating method, a bar coating method, a gravure coating method, a curtain coating method, a spray coating method, or a doctor coating method, and as the printing method employed can be a letterpress (typographic) printing method, a porous (screen) printing method, a lithographic (offset) printing method, an intaglio (gravure) printing, a spray printing method, and an ink-jet printing method. As preliminary treatment to improve adhesion property and coatability, the releasing substrate may be subjected to physical surface treatment such as corona discharge treatment or plasma discharge treatment as necessary.

<<Formation of Organic Electroluminescence Layer>>

In the invention, a layer, which is composed of all or a part of an anode buffering layer, a hole transporting layer, a light emission layer, a hole blocking layer, an electron transporting layer and a cathode buffering layer and which is provided between a transparent electrically conductive layer and a cathode, is referred to as an organic electroluminescence layer. As one example of the preparation method of this organic electroluminescence layer, the preparation method of an organic electroluminescence layer composed of hole injecting layer/hole transporting layer/light emission layer/hole blocking layer/electron transporting layer will be explained below.

An organic compound film, composed of a hole injecting layer, a hole transporting layer, a light emission layer, a hole blocking layer and an electron transporting layer each being an organic EL element material, is formed on a transparent substrate with an transparent electrically conductive layer provided thereon.

As methods of forming this organic compound film, there are a vapor deposition method and a wet process (such as a spin coating method, a cast method, an ink-jet method and a printing method), as described above. A vacuum vapor deposition method, a spin coating method, an ink-jet method and a printing method are especially preferred from the viewpoints that a homogeneous film is easily formed and pin holes are difficult to occur. Further, different coating methods may be applied for different layers. When a vapor deposition method is employed for the film formation, the vapor deposition conditions, although they vary depending on kinds of compounds employed, are appropriately selected from a boat heating temperature in the range of from 50 to 450° C., a vacuum degree in the range of from $10^{-6}$ to $10^{-2}$ Pa, a vapor deposition rate in the range of from 0.01 to 50 nm/sec, a substrate temperature in the range of from of –50° C. to 300° C., and a film thickness in the range of from 0.1 nm to 5 μm and preferably from 5 nm to 200 nm.

<<Formation of Cathode>>

After forming the organic electroluminescence layer described above, a thin film composed of a cathode material is formed on the above layer via a method such as a vapor deposition method or a sputtering method so that the film thickness is at most 1 μm and preferably in the range of from 50 nm to 200 nm. Thus, a cathode is arranged.

According to the procedure above, a desired organic EL element is prepared. It is preferred in the preparation of the organic El element that all the layers from a hole injecting layer to a cathode be formed without interruption and with one time vacuum evacuation. However, an intermediate product may be taken out during the preparation and subjected to a different film formation method. In this case, it is required to carry out the operation at a dry inert gas atmosphere.

Further, the organic EL element can be prepared in the reverse order, in which a cathode, an electron injecting layer, an electron transporting layer, a light emission layer, a hole transporting layer, a hole injecting layer, and an anode are formed in that order. In the case where a direct current voltage is applied to the thus manufactured multicolor liquid crystal display, when setting the anode as a + polarity and the cathode as a – polarity, a voltage of 2V to 40V is applied to the display, light emission is observed. An alternating current voltage may be applied, and the waveform of the alternating current may be any one.

[Use]

The organic EL element of the invention can be used as a display device, a display, or various light emission sources. Examples of the light emission sources include a home lamp, a room lamp in a car, a backlight for a watch or a liquid crystal, a light source tor boarding advertisement, a signal device, a light source for a photo memory medium, a light source for an electrophotographic copier, a light source for an optical communication instrument, and a light source for an optical sensor, but are not limited thereto. Particularly, it can be effectively used as a backlight for a liquid crystal display in combination with a color filler or a light source for illumination.

[Illumination Device]

The organic EL element of the invention is applied to an organic EL element emitting a substantially white light as an illumination device. Plural color lights emit from plural light emission materials and are mixed to obtain a white light. As such an admixture of the plural color lights, there is an admixture of the emission maximum wavelength of each of three primary colors blue, green and red or an admixture of the emission maximum wavelength of each of complementary colors such as blue and yellow or blue-green and orange.

As a combination of light emission materials to obtain plural emission colors, there is a combination of plural light emission materials (emitting dopants) emitting plural phosphorescence or fluorescence or a combination of materials emitting phosphorescence or fluorescence and dyes, which are excited by light from the light emission materials to emit light. In the white light emission organic EL element regarding the invention, a combination of plural emitting dopants is preferred.

As a method of obtaining a layer structure of an organic EL element for obtaining a plurality of emission colors, there are a method which incorporates a plurality of emission dopants in one light emission layer, a method which incorporates, in each of a plurality of light emission layers, a different dopant emitting light with an emission wavelength different from each other, and a method which arranges in the matrix form minute pixels emitting light with a wavelength different from each other.

In the white light organic EL element of the invention, patterning may be carried out through a metal mask or according to an ink-jet printing method as necessary at the layer formation. The patterning may be carried out only in electrodes, in both electrodes and light emission layer, or in all the layers of the element.

The light emission materials used in the light emission layer are not specifically limited. For example, in a back light of a liquid crystal display, platinum complex in the invention or known light emission materials are appropriately selected to suit the wavelength range corresponding to the CF (color filter) and mixed to obtain a white light.

In addition to the display device or the display as described above, the white light emission organic EL element is effectively applied to various light emission sources, an illumination device such as a home lamp or a room lamp in a car, a kind of a lamp such as an exposure light source, and a display such as a backlight for a liquid crystal display.

Further, the element is widely applied to a backlight for a watch, a light source for boarding advertisement, a signal device or a photo memory medium, a light source for an electrophotographic copier, a light source for an optical communication instrument, a light source for an optical sensor, and general electric household appliances requiring a display device.

EXAMPLES

Next, the present invention will be explained in the following examples, but is not limited thereto.

Example 1

Preparation of Light Scatter Layer Coating Solution 1

Aluminum oxide particles AO-802 produced by Admatechs Co., Ltd. was added, to a hard coat material Z7501 produced by JSR Co., Ltd. in an amount of 20% by volume based on the resin content, and dispersed for 30 minutes in an ultrasonic homogenizer (disperser) to prepare a light scatter layer coating solution 1. The particle size of the aluminum oxide particles AO-802 in the resulting light scatter layer coating solution 1 was measured employing a Zeta Sizer Nano-S produced by Malvern Co., Ltd., and as a result, the average dispersion particle size of the aluminum oxide particles AO-802 was 0.7 μm.

(Preparation of Light Scatter Layer Coating Solutions 2 through 9)

Light scatter layer coating solutions 2 through 9 were prepared in the same manner as in the light scatter layer coating solution 1 above, except that each of the light scattering particles as described later was added to Z-7501 produced by JSR. Co., Ltd. in an amount of 20% by volume based on, the content of the resin, and dispersed. The average dispersion particle size of the light scattering particles in each of the resulting coating solutions was measured, and the results are shown in Table 1.

| | |
|---|---|
| Aluminum oxide particles TM-5D | produced by Taimei Chemicals Co., Ltd. |
| Aluminum oxide particles TM-DA | produced by Taimei Cnernicals Co., Ltd. |
| Aluminum oxide particles A32 | produced by Nippon Light Metal Co., Ltd. |
| Aluminum hydroxide particles B1403 | produced by Nippon Light Metal Co., Ltd. |
| Zirconium oxide particles UEP | produced by Daiichi Kigenso Co., Ltd. |
| Zirconium oxide particles TMZ | produced by Daiichi Kigenso Co., Ltd. |
| Titanium oxide particles CR-EL | produced by Ishihara Sangyo Kaisha, Ltd. |
| Melamine resin particles Optobeads 500S | produced by Nissan Kagaku Co., Ltd. |

(Preparation of Light Scatter Layer Coating Solution 10)

Zirconium oxide particles UEP described above was added to 100 g of a hard coat material TYT 65-01 produced by Toyo Ink Manufacturing Co., Ltd. in an amount of 20% by volume based on the resin content, and dispersed for 30 minutes in an ultrasonic homogenizer (disperser) to prepare a light scatter layer coating solution 10. The average dispersion particle size of the zirconium oxide particles UEP in the coating solution 10 was measured in the same manner as above, and the result is shown in Table 1.

TABLE 1

| | Resin | | Light Scattering Particles | | | |
|---|---|---|---|---|---|---|
| | Kind | Refractive Index | Kind | Trade Name | Refractive Index | Average Dispersion Particle Size (μm) |
| Light Scatter Layer Coating Solution 1 | Z7501 | 1.5 | Aluminum Oxide | AO-802 | 1.76 | 0.7 |
| Light Scatter Layer Coating Solution 2 | Z7501 | 1.5 | Aluminum Oxide | TM-5D | 1.76 | 0.2 |
| Light Scatter Layer Coating Solution 3 | Z7501 | 1.5 | Aluminum Oxide | TM-DA | 1.76 | 0.1 |
| Light Scatter Layer Coating Solution 4 | Z7501 | 1.5 | Aluminum Oxide | A32 | 1.76 | 1.0 |
| Light Scatter Layer Coating Solution 5 | Z7501 | 1.5 | Aluminum Hydroxide | B1403 | 1.57 | 1.0 |
| Light Scatter Layer Coating Solution 6 | Z7501 | 1.5 | Zirconium Oxide | UEP | 2.15 | 0.5 |
| Light Scatter Layer Coating Solution 7 | Z7501 | 1.5 | Zirconium oxide | TMZ | 2.15 | 1.2 |
| Light Scatter Layer Coating Solution 8 | Z7501 | 1.5 | Titanium Oxide | CR-EL | 2.76 | 0.3 |
| Light Scatter Layer Coating Solution 9 | Z7501 | 1.5 | Melamine Resin | 500S | 1.65 | 0.5 |
| Light Scatter Layer Coating Solution 10 | TYT65-01 | 1.65 | Zirconium Oxide | UEP | 2.15 | 0.5 |

(Preparation of Concavo-convex Layer Coating Solution A)

Fifty grams of a hard coat material Z7501 produced by JSR Co., Ltd, were diluted wish 50 g of methyl ethyl ketone (MEK). Then, cross-linked PMMA spherical particles MX500 with an average particle size of 5 μm, produced by Soken Chemicals & Engineering Co., Ltd., was added to the resulting solution in an amount of 50% by volume based on the resin content, and dispersed for 30 minutes in an ultrasonic homogenizes (disperser) to prepare a concavo-convex layer coating solution A.

(Preparation of Concavo-convex Layer Coating Solutions B through F)

Concavo-convex layer coating solutions B through F were prepared in the same manner as in the concavo-convex layer coating solution A above, except that each of the particles as described below was added to the MEK diluted solution of tire Z7501 produced by JSR Co., Ltd. in an amount of 50% by volume based on the resin content.

| | |
|---|---|
| Cross-linked PMMA spherical particles MX150 | produced by Soken Chemicals & Engineering Co., Ltd. |
| Cross-linked PMMA spherical particles MX1000 | produced by Soken Chemicals & Engineering Co., Ltd. |

| | | | | | |
|---|---|---|---|---|---|
| Cross-linked PMMA spherical particles MX1500H | | produced by Soken Chemicals & Engineering Co., Ltd. | | | |
| Silica spherical particles FB-3SDX | | produced by Denki Kagaku Kogyo Co., Ltd. | | | |
| Silica spherical particles FB-302X | | produced by Denki Kagaku Kogyo Co., Ltd. | | | |

(Preparation of Concavo-convex Layer Coating Solution G)

FB-302X described above was added to one hundred grams of a hard coat material TYT65-01 produced by Toyo Ink Manufacturing Co., Ltd. in an amount of 50% by volume based on the resin content, and dispersed for 30 minutes in an ultrasonic homogenizer (disperser) to prepare a concavo-convex layer coating solution G.

(Preparation of Concavo-convex Layer Coating Solution H)

Fifty five grams of the light scatter layer coating solution 6 described above were mixed with 50 g of MEK and FB-302X in an amount of 30% by volume based on the resin content, and dispersed for 30 minutes in an ultrasonic homogenizer (disperser) to prepare a concavo-convex layer coating solution H.

The resulting concavo-convex layer solutions A through H are shown in Table 2.

Figure 3:
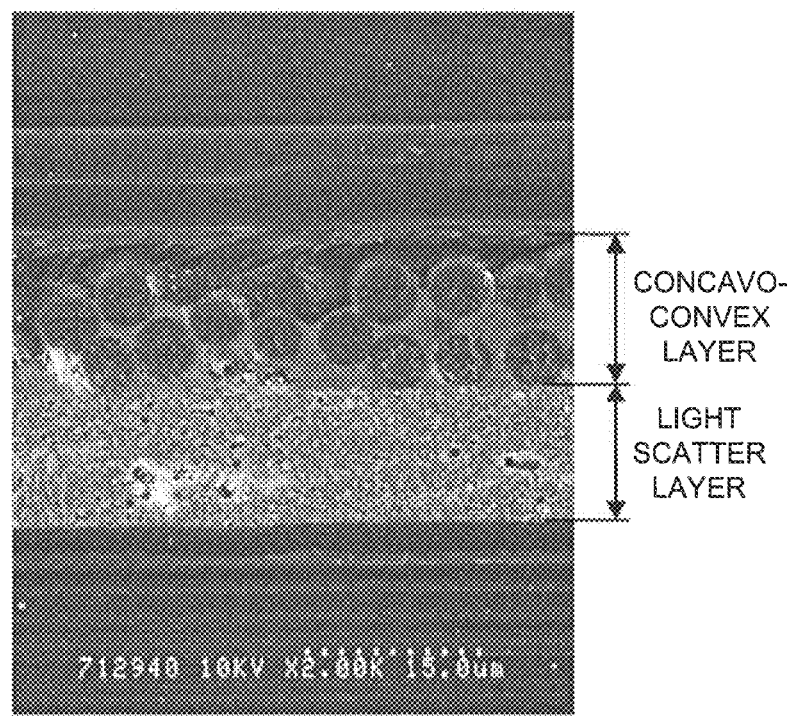
FIG. 3 shows an SEM photograph of the cross-section of the light extraction sheet 4 in EXAMPLES.
Figure 4:
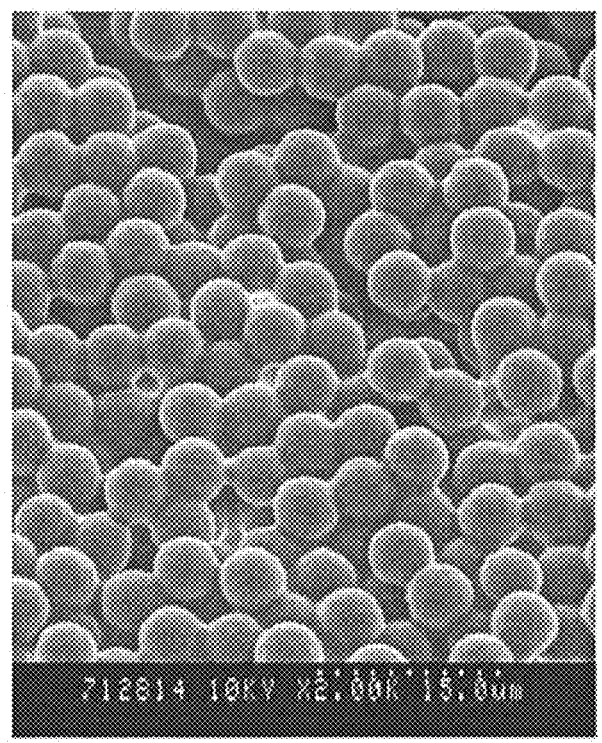
FIG. 4 shows an SEM photograph of the surface of the light extraction sheet 4.

The section of each of the resulting light extraction sheets 1 through 6 was observed by means of a scanning electron microscope, and the thickness of the light scatter layer and the concavo-convex layer was measured. Further, the concavo-convex layer being set as the light output side, haze and total optical transmittance of the sheets were measured by means of a haze meter NDH 5000 produced by Nippon Denshoku Co., Ltd. The results are shown in Tables 3 and 4. Incidentally, an SEM photograph of me section of the light extraction sheet 4, comprising a preferred concavo-convex layer in the invention formed from a plurality of spherical particles stacked one on top of another is shown in FIG. 3 and that of the surface of the light extraction sheet 4 in FIG. 4. As is apparent from FIGS. 3 and 4, two or three spherical particles with an average particle size of 5 μm, which are stacked one on top of another, are covered with a thin resin film, and a concavo-convex layer is formed in which not less than ½ of the surfaces of the spherical particles protrude therefrom.

TABLE 2

| | Resin | | Particles | | | |
|---|---|---|---|---|---|---|
| | Kind | Refractive Index | Kind | Trade Name | Refractive Index | Average Particle Size (μm) |
| Concavo-convex Layer Coating Solution A | Z7501 | 1.5 | Spherical PMMA | MX500 | 1.49 | 5.0 |
| Concavo-convex Layer Coating Solution B | Z7501 | 1.5 | Spherical PMMA | MX150 | 1.49 | 1.5 |
| Concavo-convex Layer Coating Solution C | Z7501 | 1.5 | Spherical PMMA | MX1000 | 1.49 | 9.9 |
| Concavo-convex Layer Coating Solution D | Z7501 | 1.5 | Spherical PMMA | MX1500H | 1.49 | 14.0 |
| Concavo-convex Layer Coating Solution E | Z7501 | 1.5 | Spherical Silica | FB-3SDX | 1.45 | 3.3 |
| Concavo-convex Layer Coating Solution F | Z7501 | 1.5 | Spherical Silica | FB-302X | 1.45 | 6.2 |
| Concavo-convex Layer Coating Solution G | TYT65-01 | 1.65 | Spherical Silica | FB-302X | 1.45 | 6.2 |
| Concavo-convex Layer Coating Solution H | Z7501 | 1.5 | Spherical Silica | FB-302X | 1.45 | 6.2 |
| | | | Zirconium Oxide | UEP | 2.15 | 0.5 |

(Preparation of Light Extraction Sheets 1 through 6)

Each of the front surface side light scatter layer coating solutions as described in Tables 3 and 4 was coated on one side of a 125 μm thick biaxially oriented PET film (with a refractive index of 1.65, produced by Teijin Dupont Co., Ltd.) by means of a bar coater to give a dry thickness as described in Tables 3 and 4, and cured by irradiation of ultraviolet rays. Subsequently, each of the front surface side concavo-convex layer coating solutions as described in Tables 3 and 4 was coated on each of the resulting cured layers by means of a bar coater, and cured by irradiation of ultraviolet rays. Thus, light extraction sheets 1 through 6 were prepared.

(Preparation of light Extraction Sheets 7 through 20)

Each of the rear surface side light scatter layer coating solutions as described in Tables 3 and 4 was coated on one side of a 125 μm thick biaxially oriented PET film (with a refractive index of 1.65, produced by Teijin Dupont Co., Ltd.) by means of a bar coater to give a dry thickness as described in Tables 3 and 4, and cured by irradiation of ultraviolet rays. Subsequently, each of the front surface side concavo-convex layer coating solutions as described in Tables 3 and 4 was coated on the surface of the PET film opposite the resulting light scatter layer by means of a bar coater, and cured by irradiation of ultraviolet rays. Thus, light extraction sheets 7 through 20 were prepared. With respect to the resulting light extraction sheets 7 through 20, the thickness of the light scatter layer and the concavo-convex layer was measured in the same manner as in the light extraction sheets 1 through 6. Further, the concavo-convex layer being set as the light output side, haze and total optical transmittance of the sheets were measured in the same manner as in the light extraction sheets 1 through 6. The results are shown in Tables 3 and 4.

(Preparation of light Extraction Sheet 21)

The front surface side light scatter layer coating solution and the front surface side concavo-convex layer coating solution as described in Tables 3 and 4 were coated in that order on one side of a 125 μm thick biaxially oriented PET film (with a refractive index of 1.65, produced by Teijin Dupont Co., Ltd.) in the same manner as in the light extraction sheet 1 through 6 above. After that, the rear surface side light scatter layer coating solution as described in Tables 3 and 4 was coated on the surface of the PET film opposite the resulting concavo-convex layer by means of a bar coater, and cured by irradiation of ultraviolet rays. Thus, a light extraction sheet 21 was prepared.

With respect to the resulting light extraction sheet 21, the thickness of the light scatter layer and the concavo-convex layer was measured in the same manner as above, and further, the concavo-convex layer being set as the light output side, the haze and total optical transmittance were measured in the same manner as above. The results are shown in Tables 3 and 4.

(Preparation of Comparative Sheets 1 through 6)

Each layer as shown in Tables 3 and 4 was formed on one side of a 125 μm thick biaxially oriented PET film (with a refractive index of 1.65, produced by Teijin Dupont Co., Ltd.) in the similar manner as in the light extraction sheets 1 through 21. Thus, comparative sheets 1 through 6 were prepared.

With respect to the resulting comparative sheets 1 through 6, the thickness of the light scatter layer and the concavo-convex layer was measured in the same manner as above, and further, the concavo-convex layer being set as the light output side, the haze and total optical transmittance of the sheets were measured in the same manner as above. The results are shown in Tables 3 and 4.

TABLE 3

| Light Extraction Sheet No. | Rear Surface Side Light Scatter Layer | | | | | Front Surface Side | | | | | | | | |
|---|---|---|---|---|---|---|---|---|---|---|---|---|---|---|
| | | | | | | Concavo-convex Layer | | | | Light Scatter Layer | | | | |
| | Coating Solution No. | Thickness (μm) | Light Scattering Particles | | | Coating Solution No. | Thickness (μm) | *b) (μm) | Surface Form | Coating Solution No. | Thickness (μm) | Light Scattering Particles | | |
| | | | Kind | Refractive Index | *a) (μm) | | | | | | | Kind | Refractive Index | *a) (μm) |
| Sheet 1 | — | — | — | — | — | A | 5 | 5.0 | *x | 9 | 15 | *1 | 1.65 | 0.5 |
| Sheet 2 | — | — | — | — | — | A | 16 | 5.0 | *y | 2 | 15 | *4 | 1.76 | 0.2 |
| Sheet 3 | — | — | — | — | — | A | 16 | 5.0 | *y | 4 | 15 | *4 | 1:76 | 1.0 |
| Sheet 4 | — | — | — | — | — | A | 16 | 5.0 | *y | 1 | 15 | *4 | 1.76 | 0.7 |
| Sheet 5 | — | — | — | — | — | A | 16 | 5.0 | *y | 6 | 15 | *3 | 2.15 | 0.5 |
| Sheet 6 | — | — | — | — | — | F | 18 | 6.2 | *y | 1 | 15 | *4 | 1.76 | 0.7 |
| Sheet 7 | 9 | 5 | *1 | 1.65 | 0.5 | A | 16 | 5.0 | *y | — | — | — | — | — |
| Sheet 8 | 5 | 5 | *2 | 1.57 | 1.0 | A | 5 | 5.0 | *x | — | — | — | — | — |
| Sheet 9 | 6 | 5 | *3 | 2.15 | 0.5 | A | 5 | 5.0 | *x | — | — | — | — | — |
| Sheet 10 | 1 | 8 | *4 | 1.76 | 0.7 | A | 16 | 5.0 | *y | — | — | — | — | — |
| Sheet 11 | 1 | 8 | *4 | 1.76 | 0.7 | E | 14 | 3.3 | *y | — | — | — | — | — |
| Sheet 12 | 1 | 8 | *4 | 1.76 | 0.7 | C | 20 | 9.9 | *y | — | — | — | — | — |
| Sheet 13 | 1 | 8 | *4 | 1.76 | 0.7 | F | 18 | 6.2 | *y | — | — | — | — | — |
| Sheet 14 | 6 | 5 | *3 | 2.15 | 0.5 | F | 18 | 6.2 | *y | — | — | — | — | — |
| Sheet 15 | 8 | 3 | *5 | 2.76 | 0.3 | F | 18 | 6.2 | *y | — | — | — | — | — |
| Sheet 16 | 6 | 5 | *3 | 2.15 | 0.5 | H | 18 | 6.2 | *y | — | — | — | — | — |
| Sheet 17 | 10 | 5 | *3 | 2.15 | 0.5 | F | 18 | 6.2 | *y | — | — | — | — | — |
| Sheet 18 | 10 | 5 | *3 | 2.15 | 0.5 | G | 16 | 6.2 | *y | — | — | — | — | — |
| Sheet 19 | 1 | 8 | *4 | 1.76 | 0.7 | F | 18 | 6.2 | *y | — | — | — | — | — |
| Sheet 20 | 6 | 5 | *3 | 2.15 | 0.5 | F | 18 | 6.2 | *y | — | — | — | — | — |
| Sheet 21 | 1 | 5 | *4 | 1.76 | 0.7 | A | 16 | 5.0 | *y | 1 | 3 | *4 | 1.76 | 0.7 |

| Light Extraction Sheet No | Haze | Total Optical Transmittance (%) | Remarks |
|---|---|---|---|
| Sheet 1 | 98.2 | 68.3 | Inventive |
| Sheet 2 | 98.0 | 73.5 | Inventive |
| Sheet 3 | 98.5 | 65.9 | Inventive |
| Sheet 4 | 98.2 | 71.9 | Inventive |
| Sheet 5 | 98.4 | 71.2 | Inventive |
| Sheet 6 | 98.3 | 71.5 | Inventive |
| Sheet 7 | 98.0 | 68.5 | Inventive |
| Sheet 8 | 98.1 | 65.2 | Inventive |
| Sheet 9 | 98.4 | 71.2 | Inventive |
| Sheet 10 | 98.4 | 73.4 | Inventive |
| Sheet 11 | 98.4 | 72.8 | Inventive |
| Sheet 12 | 98.4 | 71.9 | Inventive |
| Sheet 13 | 98.4 | 73.2 | Inventive |
| Sheet 14 | 98.3 | 71.0 | Inventive |
| Sheet 15 | 98.3 | 70.1 | Inventive |
| Sheet 16 | 98.3 | 72.4 | Inventive |
| Sheet 17 | 98.3 | 71.7 | Inventive |

TABLE 3-continued

| | | | |
|---|---|---|---|
| Sheet 18 | 98.3 | 72.0 | Inventive |
| Sheet 19 | 98.1 | 70.4 | Inventive |
| Sheet 20 | 98.3 | 69.5 | Inventive |
| Sheet 21 | 98.4 | 72.5 | Inventive |

*a): Average Dispersion Particle Size (μm);
*b): Particle Size of Spherical Particles (μm);
*1: Melamine Resin;
*2: Aluminum Hydroxide;
*3: Zirconium Oxide
*4: Aluminum Oxide;
*5: Titanium Oxide;
*x: Concavo-convex Form due to Mono Particle Layer;
*y: Concavo-convex Form due to Piled Particles

TABLE 4

| | Rear Surface Side Light Scatter Layer | | | | | Front Surface Side | | | | | | | | |
|---|---|---|---|---|---|---|---|---|---|---|---|---|---|---|
| | | | | | | Concavo-convex Layer | | | | Light Scatter Layer | | | | |
| Light Extraction Sheet No. | Coating Solution No. | Thickness (μm) | Light Scattering Particles | | | Coating Solution No. | Thickness (μm) | *b) (μm) | Surface Form | Coating Solution No. | Thickness (μm) | Light Scattering Particles | | |
| | | | Kind | Refractive Index | *a) (μm) | | | | | | | Kind | Refractive Index | *a) (μm) |
| *Comp. Sheet 1 | — | — | — | — | — | — | — | — | — | 6 | 5 | *3 | 2.15 | 0.5 |
| Comp. Sheet 2 | — | — | — | — | — | B | 10 | 1.5 | *w | — | — | — | — | — |
| Comp. Sheet 3 | 6 | 5 | *3 | 2.15 | 0.5 | B | 10 | 1.5 | *w | — | — | — | — | — |
| Comp. Sheet 4 | 6 | 5 | *3 | 2.15 | 0.5 | D | 15 | 14.0 | *x | — | — | — | — | — |
| Comp. Sheet 5 | 7 | 5 | *3 | 2.15 | 1.2 | A | 16 | 5.0 | *y | — | — | — | — | — |
| Comp. Sheet 6 | 3 | 8 | *4 | 1.76 | 0.1 | A | 16 | 5.0 | *y | — | — | — | — | — |

| Light Extraction Sheet No | Haze | Total Optical Transmittance (%) | Remarks |
|---|---|---|---|
| Comparative Sheet 1 | 97.8 | 87.3 | Comparative |
| Comparative Sheet 2 | 84.3 | 82.1 | Comparative |
| Comparative Sheet 3 | 97.3 | 63.5 | Comparative |
| Comparative Sheet 4 | 98.0 | 68.6 | Comparative |
| Comparative Sheet 5 | 98.7 | 62.1 | Comparative |
| Comparative Sheet 6 | 97.5 | 73.5 | Comparative |

*Comp.: Comparative;
*a): Average Dispersion Particle Size (μm);
*b): Particle Size of Spherical Particles (μm);
*3: Zirconium Oxide;
*4: Aluminum Oxide;
*w: Partial Concavo-convex Form;
*x: Concavo-convex Form due to Mono-particle Layer;
*y: Concavo-convex Form due to Piled Particles <<Preparation of Organic EL Element 1>>

A 100 nm ITO (indium tin oxide having a refractive index of 1.85) layer was formed on one side of a 125 μm thick biaxially oriented PEN film (with a refractive index of 1.75, produced by Teijin Dupont Co., Ltd.), and was subjected to patterning treatment. Then the transparent substrate 1 with the ITO transparent electrode formed thereon was subjected to ultrasonic cleaning in isopropyl alcohol, dried by a dry nitrogen gas, and subjected to UV-ozone cleaning for 5 minutes. A solution, in which poly(3,4-ethylenedioxythiophene)-polystyrene sulfonate (PEDOT/PSS, Baytron P AI 4083, produced by Bayer Co., Ltd.) was diluted by pure water to 70%, coated on the resulting transparent substrate at 3000 rpm for 30 seconds through a spin coating method, and dried at a substrate surface temperature of 200° C. for one hour to form a hole injecting layer with a thickness of 30 nm.

The resulting material was placed in a glovebox under nitrogen atmosphere where cleanness, measured according to JIS B 9920, was class 100, the dew-point temperature was not more than −80° C., and the oxygen concentration was 0.8 ppm. Subsequently, a hole transporting layer coating solution as described later was prepared in the glovebox, coated on the material at 1500 rpm for 30 seconds through a spin coating method, and dried at a substrate surface temperature of 150° C. for 30 minutes to form a hole transporting layer. Separately, the hole transporting layer coating solution above was coated on another substrate under tire same conditions as above to form a hole transporting layer, and the thickness of the resulting hole transporting layer was measured. The thickness was 20 nm.

(Hole Transporting Layer Coating Solution)

| | |
|---|---|
| Monochlorobenzene | 100 g |
| Poly-N,N'-Bis(4-butylphenyl)-N,N'-bis-(Phenyl) benzidine (ADS254BE, produced by American Dye Source Co., Ltd) | 0.5 g |

Subsequently, a light emission layer coating solution as described below was prepared and coated on the material obtained above at 2000 rpm for 30 seconds through a spin coating method, and dried at a substrate surface temperature of 120° C. for 30 minutes to form a light emission layer. The light emission layer coating solution above was coated on another substrate under the same conditions as above to from a light emission layer, and the thickness of the resulting light emission layer was measured. The thickness was 40 nm. Incidentally, in the following light emission layer composition, a compound having the lowest Tg is H-A, and the Tg thereof was 132° C.

(Light Emission Layer Coating Solution)

| | |
|---|---|
| Butyl acetate | 100 g |
| H-A | 1 g |
| D-A | 0.11 g |
| D-B | 0.002 g |
| D-C | 0.002 g |

Subsequently, an electron transiting layer coating solution as described below was prepared and coated on the material obtained above at 1500 rpm for 30 seconds through a spin coating method, and dried at a substrate surface temperature of 120° C. for 30 minutes to form an electron transporting layer. Separately, the electron transporting layer coating solution above was coated on another substrate under the same conditions as above to form an electron transporting layer, and the thickness of the resulting electron transporting layer was measured. The thickness was 30 nm.

(Electron Transporting Layer Coating Solution)

| | |
|---|---|
| 2,2,3,3-Tetrafluoro-1-propanol | 100 g |
| ET-A | 0.75 g |

The thus obtained material, in which the electron transporting layer had been formed, was put in a vacuum deposition apparatus without being exposed to atmospheric air, and the pressure in the vacuum deposition apparatus was reduced to $4 \times 10^{-4}$ Pa. Potassium fluoride and aluminum had been charged in a respective resistive heating tantalum boat, and placed in the vacuum deposition apparatus.

The resistive heating boat charged with potassium fluoride being supplied with an electric current and heated, a 3 nm thick electron injecting layer composed of potassium, fluoride was formed on the substrate, and then resistive treating boat charged with aluminum being supplied with an electric current and heated, a 100 nm thick cathode composed of aluminum was formed at a vapor deposition rate of 1 to 2 nm/second.

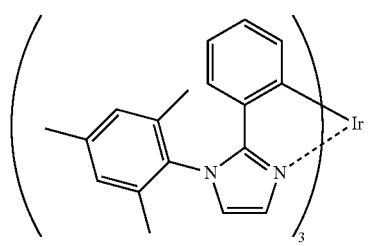

D-A

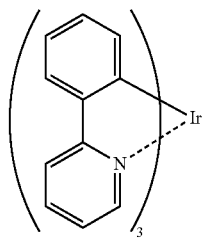

D-B

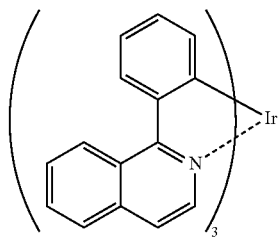

D-C

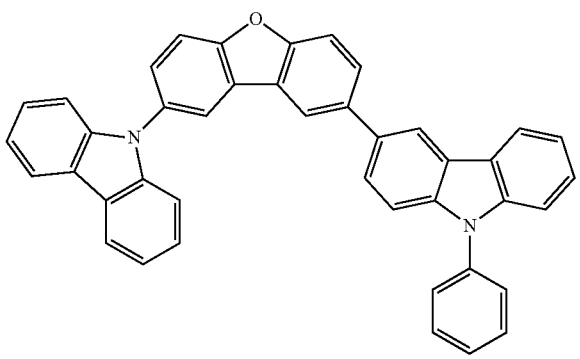

H-A

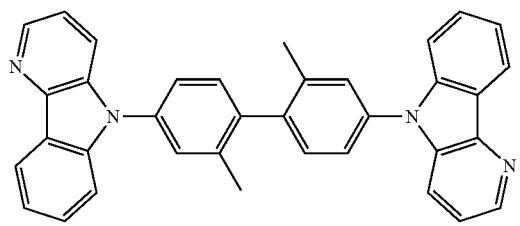

ET-A

<<Preparation of Organic EL Element Sample 2>>

An no transparent electrode, an organic electroluminescence layer and a cathode were formed in the same manner as in organic EL element 1 above, except that the electron transporting layer coating renditions were changed and adjusted to form an electron transporting layer with a thickness of 70 nm. Thus, organic EL element 2 was prepared.

<<Preparation of Organic EL Element 3>>

An ITO transparent electrode, an organic electroluminescence layer and a cathode were formed in the same manner as in organic EL element 1 above, except that the electron transporting layer coating conditions were changed and adjusted to form an electron transporting layer with a thickness of 40 nm. Thus, organic EL element 3 was prepared.

<<Preparation of Organic EL Element 4>>

An ITO transparent electrode, an organic electroluminescence layer and a cathode were formed in the same manner as in organic El element 1 above, except that the electron transporting layer coating conditions were changed and adjusted to form an electron transporting layer with a thickness of 200 nm. Thus, organic EL element 4 was prepared.

<<Evaluation of Organic EL Elements>>

[Preparation of Samples for Evaluation]

The inventive light extraction sheets 1 through 21 and comparative sheets 1 through 6 were adhered through an adhesive layer to each of organic EL element Samples 1 through 4, so that the rear side of the inventive light extraction sheets 1 through 21 and comparative sheets 1 through 6 faced the light output surface of each of organic EL elements 1 through 4. Thus, samples 1 through 35 as shown in Table 5 were prepared.

[External Extraction Quantum Efficiency]

When each of samples 1 through 35 obtained above is supplied with a constant current of 2.5 mA/cm$^2$, the external extraction quantum efficiency (%) thereof was measured under an inert gas atmosphere. The measurement was carried out employing a spectral radiance luminance meter CS-1000 (produced by Konica Minolta Sensing Co., Ltd.). The resulting external extraction quantum efficiency of each sample was represented by a value relative to the external extraction quantum efficiency of the organic EL element 1 being 100. The results are shown in Table 5.

[Luminous Intensify Distribution Characteristic]

Each of the organic EL elements obtained above was set in a spectral radiance luminance meter CS-1000 (produced by Konica Minolta Sensing Co., Ltd.), and light was emitted from the organic EL element. The light was observed which was emitted in directions inclined at various angles relative to the direction perpendicular to the front surface of the element. The luminous intensity and the spectra of the light emitted in the direction of each specific inclinational angle were measured, and the luminous intensity distribution characteristic of a red light with a wavelength of 620 nm, a green light with a wavelength of 525 nm and a blue light with a wavelength of 458 nm were determined. The front luminous intensities of the red, green and blue lights emitted in the direction perpendicular to the front surface of the element being set at 1, respectively, the relative luminous intensities of the red, green and blue lights emitted in the direction inclined at angles of 30, 45 and 60 degrees relative to the direction perpendicular to the front surface of the element were measured, the relative luminous intensities at the respective angles of the red, green and blue lights were determined, and the average thereof was calculated. The results are shown in Table 5. An organic EL element having a relative luminous intensity falling within the range of from 0.95 to 1.05 is excellent for a white light emitting illumination device, since variation of luminous intensity and chromaticity is not visually observed.

The results are shown in Table 5.

[Evaluation of Color Change with Angles of Observation]

Each surface emitter obtained above was set in a spectral radiance luminance meter CS-1000 (produced by Konica Minolta Sensing Co., Ltd.), and light, was emitted from the surface emitter. The luminous intensity and the spectra of the light emitted in a direction perpendicular to a front surface of the surface emitter and the light emitted in the direction inclined at angles of 45 and 60 degrees relative to the direction perpendicular to the front surface of the surface emitter were measured. Thus, the luminous intensity distribution characteristic of a red light, with a wavelength of 620 nm, a green light with a wavelength of 525 nm and a blue light with a wavelength of 458 nm were determined. When the front luminous intensities of the red, green and blue lights emitted in the direction perpendicular to the front surface of the surface emitter being set at 1, respectively, the relative luminous intensities of the red, green and blue lights emitted in the direction inclined at angles of 45 and 60 degrees relative to the direction perpendicular to the front surface of the surface emitter was measured. Then, the difference in the relative luminous intensities of the red, green and blue lights between the respective angles was calculated, and color change with the angles of observation was evaluated according to the following evaluation criteria.

The results are shown in Table 5.

A: The difference in the relative luminous intensities was less than 0.02.

B: The difference in the relative luminous intensities was from 0.02 to less than 0.05.

A: The difference in the relative luminous intensities was not less than 0.05.

TABLE 5

|  | b) |  | | | f) | | | |
|---|---|---|---|---|---|---|---|---|
|  | a) | c) | d) | e) | 30 deg. | 45 deg. | 60 deg. | Remarks |
| Sample 1 | 1 | — | 30 | 100 | 0.95 | 0.98 | 1.02 | Comparative |
| Sample 2 | 1 | Sheet 13 | 30 | 120 | 0.98 | 1.00 | 1.01 | Inventive |
| Sample 3 | 2 | — | 70 | 80 | 1.15 | 1.33 | 1.21 | Comparative |
| Sample 4 | 2 | Sheet 1 | 70 | 140 | 1.03 | 1.05 | 1.05 | Inventive |
| Sample 5 | 2 | Sheet 2 | 70 | 140 | 1.03 | 1.04 | 1.03 | Inventive |
| Sample 6 | 2 | Sheet 3 | 70 | 136 | 1.02 | 1.02 | 1.05 | Inventive |
| Sample 7 | 2 | Sheet 4 | 70 | 145 | 1.01 | 1.02 | 1.01 | Inventive |
| Sample 8 | 2 | Sheet 5 | 70 | 150 | 1.01 | 1.01 | 1.01 | Inventive |
| Sample 9 | 2 | Sheet 6 | 70 | 148 | 0.98 | 1.00 | 1.00 | Inventive |
| Sample 10 | 2 | Sheet 7 | 70 | 138 | 1.04 | 1.03 | 1.04 | Inventive |
| Sample 11 | 2 | Sheet 8 | 70 | 150 | 1.05 | 1.05 | 1.05 | Inventive |
| Sample 12 | 2 | Sheet 9 | 70 | 145 | 1.04 | 1.04 | 1.05 | Inventive |
| Sample 13 | 2 | Sheet 10 | 70 | 162 | 0.99 | 1.00 | 1.00 | Inventive |
| Sample 14 | 2 | Sheet 11 | 70 | 153 | 0.98 | 0.99 | 0.98 | Inventive |
| Sample 15 | 2 | Sheet 12 | 70 | 148 | 0.99 | 1.01 | 1.00 | Inventive |
| Sample 16 | 2 | Sheet 13 | 70 | 165 | 1.00 | 0.99 | 1.00 | Inventive |
| Sample 17 | 2 | Sheet 14 | 70 | 160 | 1.00 | 1.00 | 1.00 | Inventive |
| Sample 18 | 2 | Sheet 15 | 70 | 155 | 0.99 | 0.98 | 0.97 | Inventive |
| Sample 19 | 2 | Sheet 16 | 70 | 158 | 1.00 | 1.00 | 1.00 | Inventive |
| Sample 20 | 2 | Sheet 17 | 70 | 155 | 0.98 | 0.99 | 1.01 | Inventive |
| Sample 21 | 2 | Sheet 18 | 70 | 152 | 1.01 | 1.00 | 1.01 | Inventive |
| Sample 22 | 2 | Sheet 19 | 70 | 150 | 1.00 | 0.99 | 1.01 | Inventive |
| Sample 23 | 2 | Sheet 20 | 70 | 151 | 0.98 | 1.00 | 1.01 | Inventive |
| Sample 24 | 2 | Sheet 21 | 70 | 148 | 0.99 | 0.99 | 0.10 | Inventive |
| Sample 25 | 2 | Comparative sheet 1 | 70 | 85 | 1.02 | 1.05 | 1.08 | Comparative |
| Sample 26 | 2 | Comparative sheet 2 | 70 | 90 | 1.13 | 1.28 | 1.19 | Comparative |

TABLE 5-continued

|  | b) |  | d) | e) | f) | | | Remarks |
|---|---|---|---|---|---|---|---|---|
|  | a) | c) |  |  | 30 deg. | 45 deg. | 60 deg. |  |
| Sample 27 | 2 | Comparative sheet 3 | 70 | 103 | 1.09 | 1.17 | 1.14 | Comparative |
| Sample 28 | 2 | Comparative sheet 4 | 70 | 115 | 1.08 | 1.15 | 1.14 | Comparative |
| Sample 29 | 2 | Comparative sheet 5 | 70 | 128 | 1.02 | 1.03 | 1.05 | Comparative |
| Sample 30 | 2 | Comparative sheet 6 | 70 | 140 | 1.05 | 1.07 | 1.10 | Comparative |
| Sample 31 | 3 | Comparative sheet 6 | 40 | 130 | 1.05 | 1.07 | 1.10 | Comparative |
| Sample 32 | 3 | Sheet 14 | 40 | 150 | 0.98 | 0.99 | 1.00 | Inventive |
| Sample 33 | 4 | Comparative sheet 6 | 200 | 98 | 1.12 | 1.16 | 1.21 | Comparative |
| Sample 34 | 4 | Sheet 14 | 200 | 140 | 1.03 | 1.03 | 1.05 | Inventive |
| Sample 35 | 4 | Sheet 14 | 200 | 155 | 1.02 | 1.03 | 1.03 | Inventive | a): Organic EL Element No.;
b): Resin of Light Scatter Layer;
c): Light Extraction Sheet No.;
d): Thickness of Electron Transporting Layer (nm);
e): External Extraction Quantum Efficiency;
f): Luminous Intensity Distribution Characteristic As is apparent from Table 5, the organic EL elements having the inventive constitution provide high external extraction quantum efficiency and less color change with the angles of observation, and are excellent for a white light, emitting illumination device.

Example 2

Inventive sample 13 prepared in Example 1 was put in a glass case to prepare an illumination device. The glass case was charged with a nitrogen gas, and a moisture capturing agent was put on the side of the sample opposite the light output surface in the glass case.

The illumination device of the invention can be employed as a thin, white light emitting illumination device with high emission efficiency and long emission life.

Example 3

Inventive sample 13 prepared in Example 1 was covered with a transparent barrier film (a transparent resin film covered with a silicon dioxide film) to prepare a flexible illumination device. The illumination device of the invention can be employed as a thin, white light emitting illumination device, which even when it is somewhat bent, exhibits high emission efficiency and long emission life.

EXPLANATION OF SYMBOLS

1. Transparent Resin Film
2. Spherical Particles

The invention claimed is:

1. A light extraction sheet comprising:
a transparent resin film and provided thereon,
a light scatter layer containing a first binder resin and light scattering particles with an average particle size of from 0.2 to 1.0 μm dispersed in the first binder resin, and
a concavo-convex layer containing a second binder resin and spherical particles with an average particle size of from 3 to 10 μm,
wherein a content of the spherical particles in the concavo-convex layer is from 20 to 70% by volume of the second binder resin,
wherein the sheet has a haze of not less than 98%, and
wherein the light scatter layer and the concavo-convex layer are disposed on a same side of the transparent resin film, and the light scatter layer is disposed between the transparent resin film and the concavo-convex layer.

2. The light extraction sheet of claim 1, wherein the concavo-convex layer is a layer formed from a plurality of the spherical particles stacked one on top of another.

3. The light extraction sheet of claim 1, wherein the light scattering particles are inorganic oxide particles with a refractive index of not less than 1.6.

4. The light extraction sheet of claim 1, wherein the concavo-convex layer comprises a concavo-convex structure in which not less than ¼ of surfaces of the spherical particles protrude from a surface of the concavo-convex layer.

5. The light extraction sheet of claim 1, wherein an amount of the light scattering particles in the light scatter layer is 10 to 40% by volume of the first binder resin.

6. The light extraction sheet of claim 1, wherein the light scattering particles have the average particle size of from 0.2 to 0.7 μm.

* * * * *